(12) United States Patent
Kang et al.

(10) Patent No.: US 11,538,737 B2
(45) Date of Patent: Dec. 27, 2022

(54) SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Kyungdon Mun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 17/012,294

(22) Filed: Sep. 4, 2020

(65) Prior Publication Data
US 2021/0210414 A1 Jul. 8, 2021

(30) Foreign Application Priority Data

Jan. 3, 2020 (KR) ........................ 10-2020-0000864

(51) Int. Cl.
*H01L 23/485* (2006.01)
*H01L 23/538* (2006.01)
*H01L 21/48* (2006.01)
*H01L 23/00* (2006.01)

(52) U.S. Cl.
CPC ........ *H01L 23/485* (2013.01); *H01L 21/4814* (2013.01); *H01L 23/5389* (2013.01); *H01L 24/05* (2013.01); *H01L 24/13* (2013.01); *H01L 24/16* (2013.01); *H01L 24/32* (2013.01); *H01L 2224/02311* (2013.01); *H01L 2224/02331* (2013.01); *H01L 2224/02379* (2013.01); *H01L 2224/02381* (2013.01); *H01L 2224/0401* (2013.01); *H01L 2224/05548* (2013.01); *H01L 2224/13024* (2013.01); *H01L 2224/16227* (2013.01); *H01L 2224/16505* (2013.01); *H01L 2224/32175* (2013.01)

(58) Field of Classification Search
CPC .................................................... H01L 23/485
See application file for complete search history.

(56) References Cited

U.S. PATENT DOCUMENTS 9,502,335 B2 11/2016 Lai et al.
9,548,219 B2 1/2017 Chen et al.
10,056,350 B2 8/2018 Lin et al.
(Continued)

*Primary Examiner* — William A Harriston
(74) *Attorney, Agent, or Firm* — Lee IP Law, P.C.

(57) ABSTRACT

A semiconductor package includes a redistribution substrate having a first redistribution layer, a semiconductor chip on the redistribution substrate and connected to the first redistribution layer, a vertical connection conductor on the redistribution substrate and electrically connected to the semiconductor chip through the first redistribution layer, a core member having a first through-hole accommodating the semiconductor chip and a second through-hole accommodating the vertical connection conductor, and an encapsulant covering at least a portion of each of the semiconductor chip, the vertical connection conductor, and the core member, the encapsulant filling the first and second through-holes, wherein the vertical connection conductor has a cross-sectional shape with a side surface tapered to have a width of a lower surface thereof is narrower than a width of an upper surface thereof, and the first and second through-holes have a cross-sectional shape tapered in a direction opposite to the vertical connection conductor.

20 Claims, 18 Drawing Sheets

(56) References Cited

U.S. PATENT DOCUMENTS

| | | |
|---|---|---|
| 10,325,891 B1 | 6/2019 | Lim et al. |
| 10,373,887 B2 * | 8/2019 | Ha .................... H01L 23/49816 |
| 10,388,598 B2 | 8/2019 | Lu et al. |
| 10,396,005 B2 * | 8/2019 | Kim .................. H01L 23/49822 |
| 2013/0113091 A1 | 5/2013 | Meng et al. |
| 2013/0320530 A1 | 12/2013 | Koey et al. |
| 2014/0110728 A1 * | 4/2014 | Lee ....................... H01L 25/075 |
| | | 438/27 |
| 2017/0053898 A1 * | 2/2017 | Yeh ......................... H01L 25/50 |
| 2017/0278766 A1 * | 9/2017 | Kim ................... H01L 23/5386 |
| 2017/0309571 A1 * | 10/2017 | Yl ....................... H01L 23/5384 |
| 2018/0301350 A1 | 10/2018 | Haba et al. |
| 2018/0331018 A1 | 11/2018 | Shim et al. |
| 2019/0148264 A1 | 5/2019 | Chang et al. |
| 2019/0237343 A1 | 8/2019 | Huemoeller et al. |

* cited by examiner

A-A'

B-B'

B-B'

SEMICONDUCTOR PACKAGE

CROSS-REFERENCE TO RELATED APPLICATION

Korean Patent Application No. 10-2020-0000864, filed on Jan. 3, 2020, in the Korean Intellectual Property Office, and entitled: "Semiconductor Package," is incorporated by reference herein in its entirety.

BACKGROUND

1. Field

The present disclosure relates to a semiconductor package.

2. Description of the Related Art

In recent years, interest in semiconductor packages having improved rigidity and heat dissipation characteristics has increased with the increase in performance of semiconductor chips.

SUMMARY

According to an aspect of embodiments, a semiconductor package includes a redistribution substrate having a first surface and a second surface opposite each other, the redistribution substrate including a first redistribution layer, a semiconductor chip on the first surface of the redistribution substrate, the semiconductor chip including a connection pad connected to the first redistribution layer, at least one vertical connection conductor on the first surface of the redistribution substrate, the at least one vertical connection conductor being electrically connected to the connection pad of the semiconductor chip through the first redistribution layer, a core member including a first through-hole and at least one second through-hole, the first through-hole accommodating the semiconductor chip, and the at least one second through-hole accommodating the at least one vertical connection conductor, an encapsulant covering the semiconductor chip on the first surface of the redistribution substrate, the encapsulant filling the first through-hole and at least one second through-hole, and a redistribution member on the encapsulant, the redistribution member including a second redistribution layer electrically connected to the at least one vertical connection conductor, wherein the at least one vertical connection conductor and the core member include a same material, wherein a width of a lower surface of the at least one vertical connection conductor is narrower than a width of an upper surface of the vertical connection conductor, the lower surface of the at least one vertical connection conductor facing the redistribution substrate, wherein a width of a lower end of the first through-hole is greater than a width of an upper end of the first through-hole, and wherein a width of a lower end of the at least one second through-hole is greater than a width of an upper end of the at least one second through-hole, the lower ends of the first through-hole and at least one second through-hole facing the redistribution substrate.

In addition, according to an aspect of embodiments, a semiconductor package may include a redistribution substrate including a first redistribution layer, a semiconductor chip disposed on the redistribution substrate and connected to the first redistribution layer, a vertical connection conductor disposed on the redistribution substrate, and electrically connected to the semiconductor chip through the first redistribution layer, a core member having a first through-hole accommodating the semiconductor chip and a second through-hole accommodating the vertical connection conductor, and an encapsulant covering at least a portion of the semiconductor chip, the vertical connection conductor, and the core member, and filling the first and second through-holes, wherein the vertical connection conductor has a cross-sectional shape, in which a side surface of the vertical connection conductor is tapered such that a width of a lower surface of the vertical connection conductor is narrower than a width of an upper surface of the vertical connection conductor, and the first and second through-holes have a cross-sectional shape tapered in a direction opposite to the vertical connection conductor, respectively.

In addition, according to an aspect of embodiments, a semiconductor package may include a redistribution substrate including a first redistribution layer, a semiconductor chip disposed on the redistribution substrate, and having a connection pad connected to the first redistribution layer, a vertical connection conductor spaced apart from the semiconductor chip on the redistribution substrate, and electrically connected to the connection pad through the first redistribution layer, a core member having a first through-hole accommodating the semiconductor chip and a second through-hole accommodating the vertical connection conductor, an encapsulant disposed on the redistribution substrate and filling the first and second through-holes, respectively and covering an upper surface of the semiconductor chip and an external side surface of the core member, and a redistribution member disposed on an upper surface of the encapsulant, and having a second redistribution layer electrically connected to the vertical connection conductor, wherein the upper surface of the encapsulant is on the same plane as the upper surface of the vertical connection conductor and the upper surface of the core member, and a planar area of a lower surface of the vertical connection conductor is smaller than a planar area of the upper surface of the vertical connection conductor, and a planar area of a lower surface of the core member is smaller than a planar area of the upper surface of the core member.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
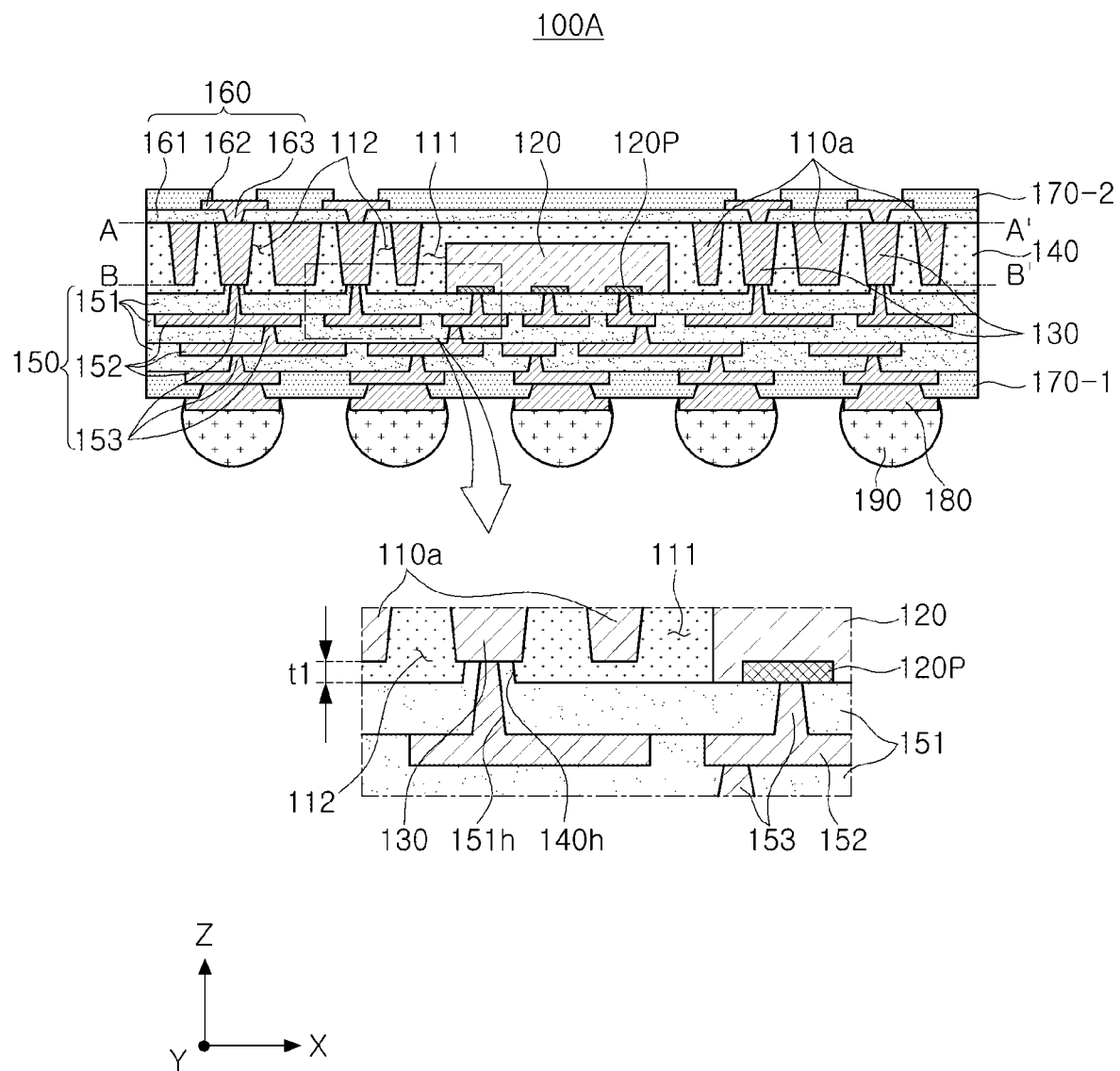
FIG. 1 is a cross-sectional view showing a semiconductor package according to an embodiment.
Figure 2A:
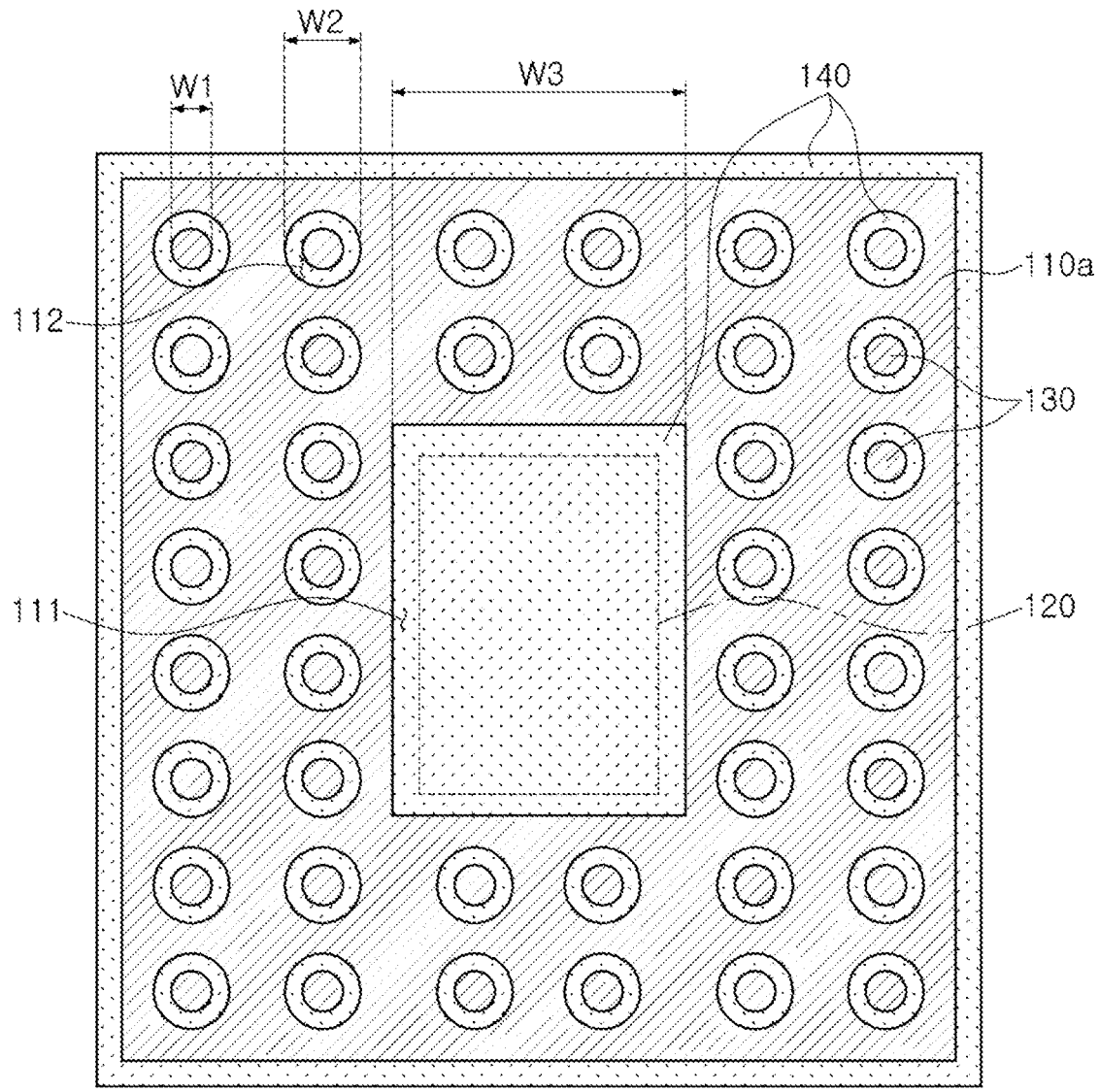
FIGS. 2A and 2B are plan views along cutting surfaces A-A' and B-B', respectively, in FIG. 1.
Figure 2A:
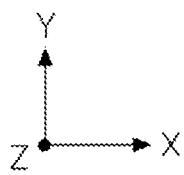

FIG. 1 is a cross-sectional view showing a semiconductor package 100A according to an example embodiment. FIG. 2A is a plan view along the cutting surface A-A' in FIG. 1 as viewed from above, and FIG. 2B is a plan view of the cutting surface B-B' in FIG. 1 as viewed from below.

Figure 2B:
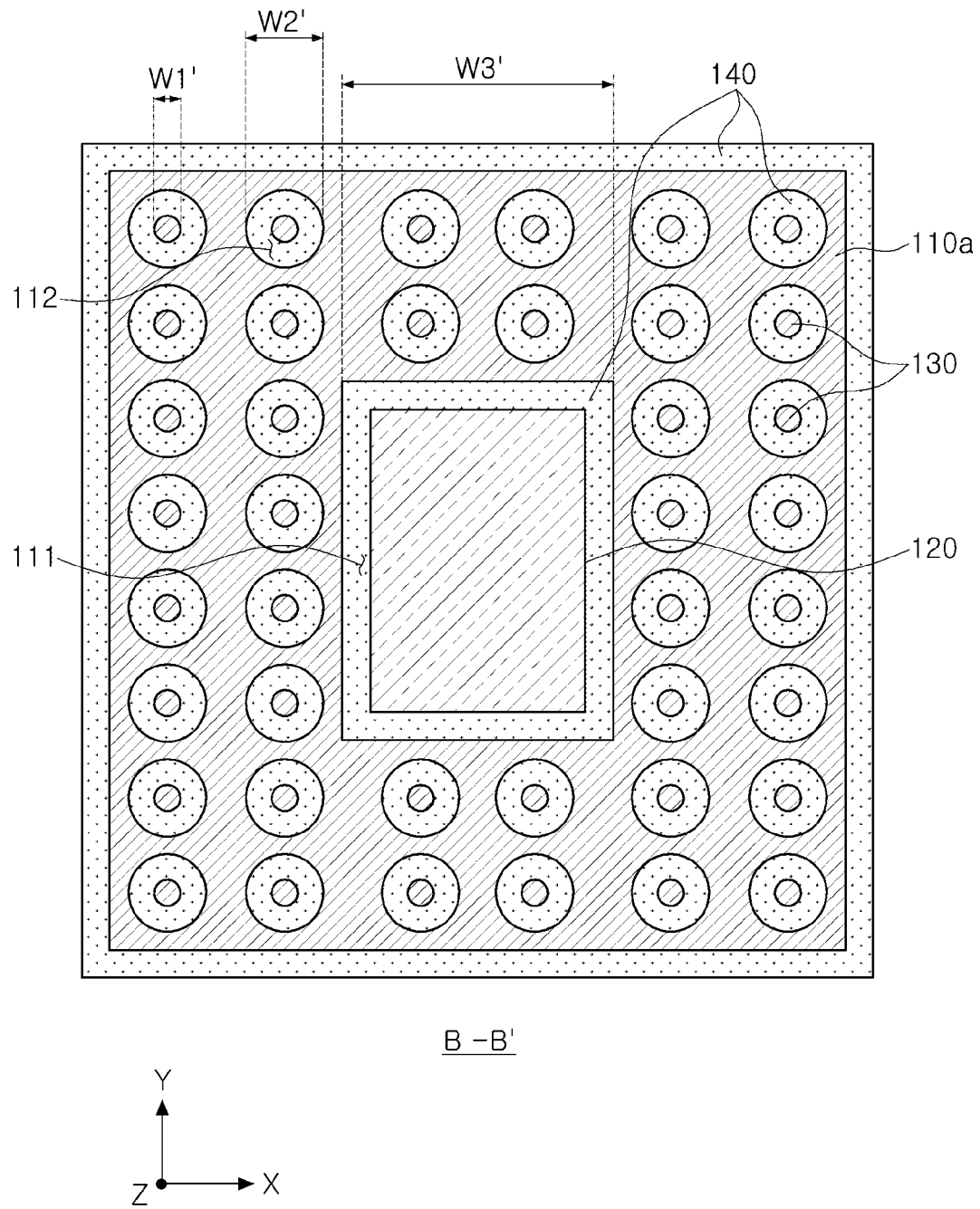

Referring to FIGS. 1 and 2A to 2B, a semiconductor package 100A may include a core member 110a, a semiconductor chip 120, a vertical connection conductor 130, an encapsulant 140, a redistribution substrate 150, and a redistribution member 160. In addition, the semiconductor package 100A may further include passivation layers 170-1 and 170-2, an underbump metal 180, and a connection bump 190.

The core member 110a may include a body having a plate shape having a thickness, e.g., along the Z direction, equal to or greater than that of the semiconductor chip 120. Further, the core member 110a may include a first through-hole 111 penetrating the body, in which the semiconductor chip 120 is disposed, and a second through-hole 112, in which the vertical connection conductor 130 is disposed. For example, as illustrated in FIG. 1, the semiconductor chip 120 may be inside the first through-hole 111 of the core member 110a, so the sidewalls of the first through-hole 111 may extend above, e.g., and surround a perimeter of (FIGS. 2A-2B), the semiconductor chip 120.

For example, the first through-hole 111 may be formed in a central portion of the core member 110a (e.g., a fan-in region), and the second through-hole 112 may be formed in an external, e.g., peripheral, portion of the core member 110a (e.g., a fan-out region). For example, as illustrated in FIGS. 2A and 2B, a plurality of second through-holes 112 may surround the first through-hole 111. The first and second through-holes 111 and 112 may be formed by etching the body of the core member 110a in a plate state ("CM" in FIG. 4A). Therefore, an external, e.g., outermost, side surface of the core member 110a may have a vertical cross-sectional shape tapered with respect to a center of the core member 110a, and inner side surfaces of the core member 110a, i.e., sidewall surfaces of the first and second through-holes 111 and 112, may have a vertical cross-sectional shape tapered with respect to centers of the first and second through-holes 111 and 112.

In detail, the first and second through-holes 111 and 112 may have a vertical cross-sectional shape, in which the sidewall surfaces of each of the first and second through-holes 111 and 112 are tapered. For example, referring to FIG. 1, each of the first and second through-holes 111 and 112 may have, e.g., gradually, increasing widths along the X direction as a vertical distance along the Z direction from the redistribution substrate 150 decreases. For example, a width, e.g., along the X direction, of a lower end of the first through-hole 111 (W3' in FIG. 2B) may be greater than a width, e.g., along the X direction, of an upper end of the first through-hole 111 (W3 in FIG. 2A), and a width, e.g., along the X direction, of a lower end of the second through-hole 112 (W2' in FIG. 2B) may be greater than a width, e.g., along the X direction, of an upper end of the second through-hole 112 (W2 in FIG. 2B).

The width of the lower end of the first through-hole 111 (W3' in FIG. 2B) is a value obtained by adding a width of the semiconductor chip 120 and a separation distance between both ends of the semiconductor chip 120 opposing each other and a lower end of the first through-hole 111. For example, the value of W3' in FIG. 2B may be obtained by adding a width of a bottom of the semiconductor chip 120, e.g., along the X direction, and a separation distance, e.g., along the X direction, between each end, e.g., edge, of the bottom of the semiconductor chip 120 and its corresponding facing sidewall of the first through-hole 111. For example, the separation distance between each of the ends of the semiconductor chip 120 and the lower end of the sidewall of the first through-hole 111 may be about 110 μm.

The width of the upper end of the first through-hole 111 (W3 in FIG. 2A) is a value obtained by adding a width of the semiconductor chip 120 and a separation distance between both ends of the semiconductor chip 120 opposing each other and an upper end of the first through-hole 111. For example, the value of W3 in FIG. 2A may be obtained by adding a width of a top of the semiconductor chip 120, e.g., along the X direction, and a separation distance, e.g., along the X direction, between each end, e.g., edge, of the top of the semiconductor chip 120 and its corresponding facing sidewall of the first through-hole 111. For example, the separation distance between each of ends of the semiconductor chip 120 and the upper end of the first through-hole 111 may be about 60 μm.

The width of the lower end of the second through-hole 112 (W2' in FIG. 2B) is a value obtained by adding a width of a lower portion of the corresponding vertical connection conductor 130 and a separation distance between both ends of the vertical connection conductor 130 opposing each other and a lower end of the second through-hole 112. For example, the value of W2' in FIG. 2B may be obtained by adding a width of a bottom of the vertical connection conductor 130, e.g., along the X direction, and a separation distance, e.g., along the X direction, between each end, e.g., edge, of the bottom of the vertical connection conductor 130 and its corresponding facing sidewall of the second through-hole 112. For example, the separation distance between each of the ends of the vertical connection conductor 130 and the lower end of the second through-hole 112 may be about 160 μm.

The width of the upper end of the second through-hole 112 (W2 in FIG. 2B) is a value obtained by adding a width of an upper portion of the corresponding vertical connection conductor 130 and a separation distance between both ends of the vertical connection conductor 130 opposing each other and the upper end of the second through-hole 112. For example, the value of W2 in FIG. 2A may be obtained by adding a width of a top of the vertical connection conductor 130, e.g., along the X direction, and a separation distance, e.g., along the X direction, between each end, e.g., edge, of the top of the vertical connection conductor 130 and its corresponding facing sidewall of the second through-hole 112. For example, the separation distance between each of the ends of the vertical connection conductor 130 and the upper end of the second through-hole 112 may be about 60 μm.

In addition, a planar area of the lower surface of the core member 110a may be smaller than a planar area of the upper surface thereof. For example, referring to FIGS. 2A and 2B, a planar area (hatched area in FIG. 2B surrounding the semiconductor chip 200) of the lower surface (which faces the redistribution substrate 150) of the core member 110a may be smaller than a planar area (hatched area in FIG. 2A surrounding the semiconductor chip 200) of the upper surface (which faces the redistribution member 160) thereof.

The core member 110a may improve rigidity of the semiconductor package 100A and control warpage. In addition, heat generated in the semiconductor chip 120 may be discharged to the outside of the semiconductor package 100A through the core member 110a. The core member 110a may include a metal material, e.g., copper (Cu), but is not limited thereto, and may include other metal materials, e.g., aluminum (Al), silver (Ag), tin (Sn), gold (Au), nickel (Ni), lead (Pb), titanium (Ti), or alloys thereof. The core member 110a may be used as a ground (GND) for the semiconductor chip 120, or may be used as a dummy pattern.

The vertical connection conductor 130 may be disposed in the second through-hole 112 of the core member 110a, and may be on a first surface of the redistribution substrate 150, e.g., on a surface facing the core member 110a. The vertical connection conductor 130 may be electrically connected to a connection pad 120P of the semiconductor chip 120 through a first redistribution layer 152 of the redistribution substrate 150. The vertical connection conductor 130 may include the same material as the core member 110a, and may have an island structure, electrically insulated from the core member 110a by the encapsulant 140 filling the second through-hole 112 of the core member 110a.

The vertical connection conductor 130 may be formed together with the first and second through-holes 111 and 112 of the core member 110a. For example, as will be described in more detail below with reference to FIG. 4B, the vertical connection conductor 130 may be formed simultaneously with and from a same metal plate as the core member 110a by forming the first and second through-holes 111 and 112 through the metal plate, e.g., so the second through-holes 112 may be formed through the metal plate to surround a perimeter of the resultant respective vertical connection conductors 130. Accordingly, the vertical connection conductor 130 may be formed of the same, e.g., identical, material as the core member 110a. Further, the vertical connection conductor 130 and the core member 110a may have coplanar bottom surfaces and coplanar top surfaces, e.g., the vertical connection conductor 130 may have a same height along the Z direction as the core member 110a. The vertical connection conductor 130 may have a vertical cross-sectional shape, in which a side surface connecting the lower surface and the upper surface thereof is tapered, e.g., the vertical cross-sectional shapes of the vertical connection conductor 130 and the core member 110a may be similarly tapered in terms of angle and direction due to same material and same etching process.

For example, the side surface of the vertical connection conductor 130 may have a vertical cross-sectional shape tapered with respect to the center of the vertical connection conductor 130, and the width of the lower surface of the vertical connection conductor 130 (W1' in FIG. 2B) may be narrower than the width of the upper surface of the vertical connection conductor 130 (W1 in FIG. 2A). For example, the width of the lower surface of the vertical connection conductor 130 (W1' in FIG. 2B) may be about 60 μm to 240 μm and the width of the upper surface of the vertical connection conductor 130 (W1 in FIG. 2A) may be about 100 μm to 340 μm. The side surfaces of the core member 110a may have a cross-sectional shape tapered in the same direction as the vertical connection conductor 130, and the first and second through-holes 111 and 112 may have a cross-sectional shape tapered in a direction opposite to the vertical connection conductor 130, respectively. In addition, a planar area of the lower surface of the vertical connection conductor 130 (i.e., a surface facing the redistribution substrate 150 and illustrated in FIG. 2B) may be smaller than a planar area of the upper surface thereof (i.e., a surface facing the redistribution member 160 and illustrated in FIG. 2A).

Figure 2C:
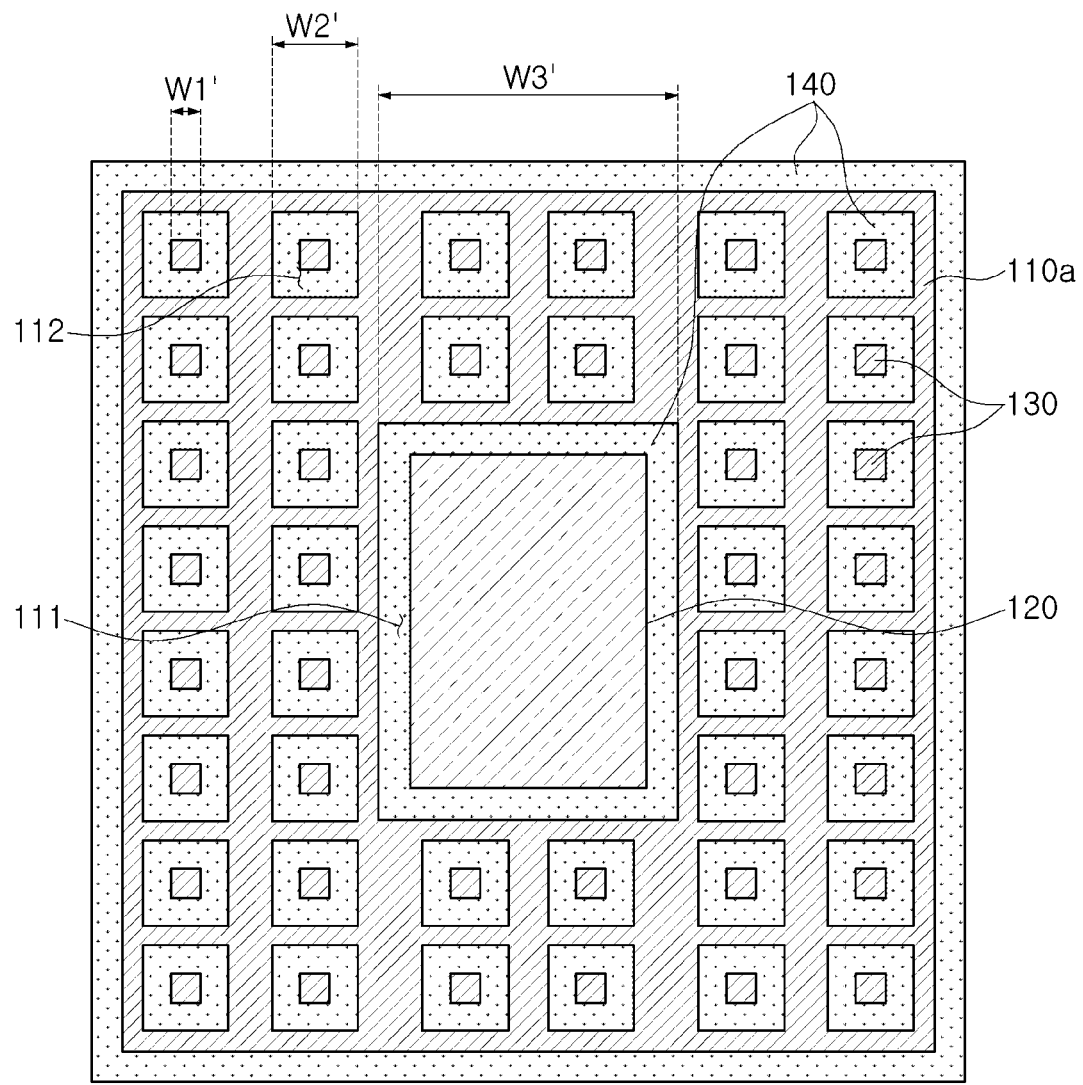
FIGS. 2C and 2D are plan views showing modification examples of FIGS. 2A and 2B, respectively.
Figure 2D:
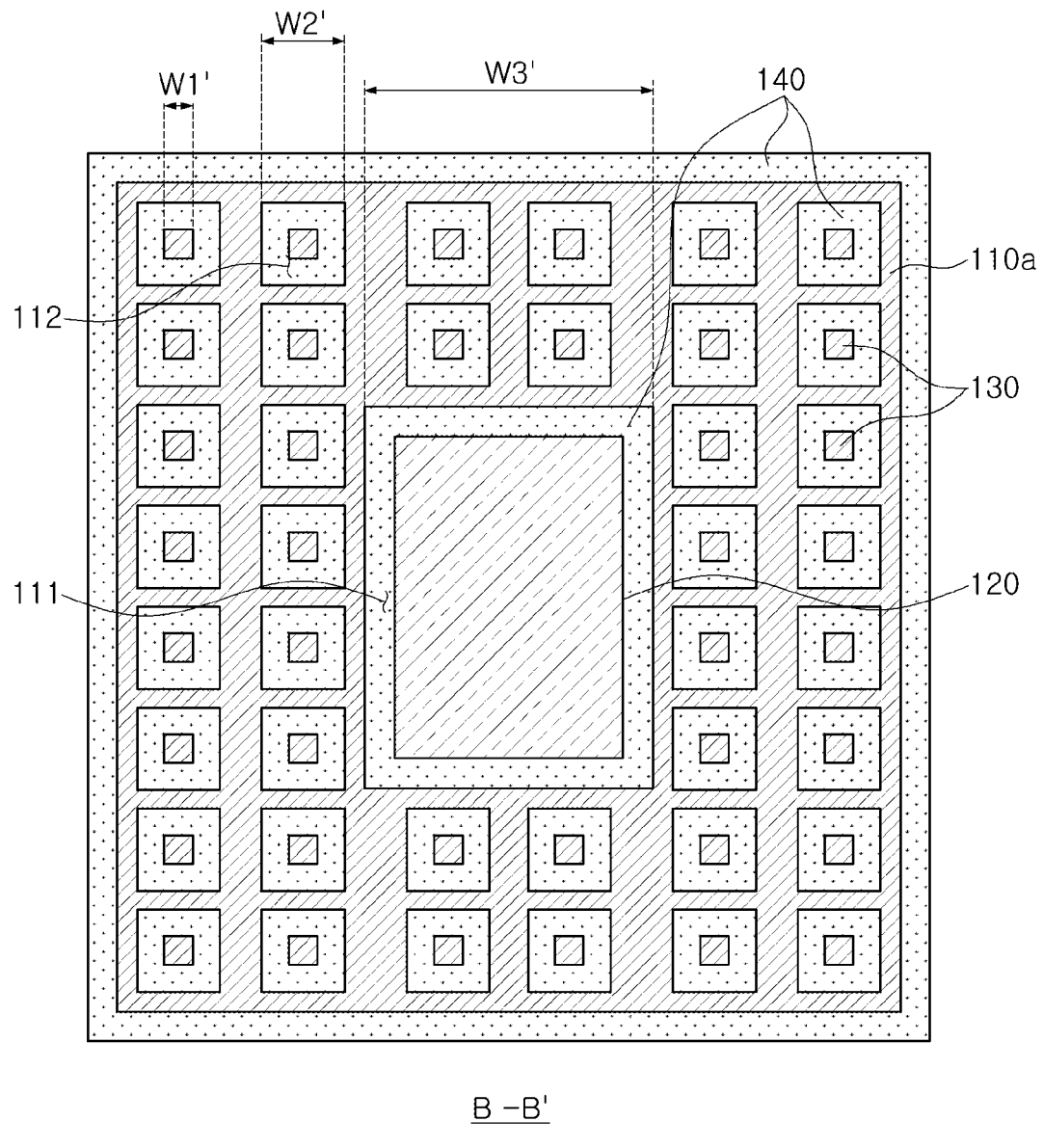

A horizontal cross-sectional shape (a cross-sectional shape as viewed in a top view) of the vertical connection conductor 130 is not specifically limited. For example, as illustrated in FIGS. 2A and 2B, the horizontal cross-section of the vertical connection conductor 130 may have a circular shape. In another example, the horizontal cross-section of the vertical connection conductor 130 may have an ellipse shape or a square shape. In yet another example, as shown in the modification examples in FIGS. 2C and 2D, a horizontal cross-section of the vertical connection conductor 130 may have a rectangular shape. In this case, the horizontal cross-section of the vertical connection conductor 130 and the horizontal cross-section of the second through-hole 112 accommodating the vertical connection conductor 130 may have similar shapes.

In an example embodiment, the vertical connection conductor 130 may include a plurality of vertical connection conductors spaced apart from each other. The core member 110a may have a plurality of second through-holes 112 accommodating each of the plurality of vertical connection conductors 130, and the plurality of second through-holes 112 may be spaced apart from each other, e.g., in the X and Y direction.

The vertical connection conductor 130 may provide an electrical connection path connecting upper/lower components of the semiconductor package 100A. The vertical connection conductor 130 may be spaced apart and isolated from a side wall surface of the second through-hole 112 within the second through-hole 112. The vertical connection conductor 130 may be connected to a first redistribution via 153 of the redistribution substrate 150 and a second redistribution via 163 of the redistribution member 160. A package-on-package structure in which other packages are coupled to an upper portion of the semiconductor package 100A by the vertical connection conductor 130 can be easily implemented. The vertical connection conductor 130 may include a metal material, such as the core member 110a, e.g., copper (Cu), but is not limited thereto, and may include other metal materials, e.g., aluminum (Al), silver (Ag), tin (Sn), gold (Au), nickel (Ni), lead (Pb), titanium (Ti), or alloys thereof. The vertical connection conductor 130 may be used as a signal pattern for the semiconductor chip 120.

In general, in order to reinforce vulnerabilities, e.g., low rigidity, low heat dissipation, etc., of a molding material covering a periphery of a semiconductor chip in a semiconductor package, an insulating structure for improving rigidity or/and a conductive structure for improving warpage characteristics and forming an electrical connection path may be disposed in the semiconductor package. However, when several process steps are applied to manufacturing and processing of structures embedded in the semiconductor package, the manufacturing time and costs of the semiconductor package itself may be increased, and a yield of the semiconductor package may be deteriorated.

Accordingly, in example embodiments, a core member capable of improving the rigidity and warpage characteristics of the semiconductor package and a vertical connection conductor forming an electrical path in the package may be simultaneously manufactured by etching a single metal plate, thereby improving the rigidity, warpage characteristics, and heat dissipation characteristics of the semiconductor package while minimizing the number of additional processes. Accordingly, in an example embodiment, the core member 110a and the vertical connection conductor 130 may include the same metal material as each other, and side surfaces (inner and external side surfaces) of the core member 110a and a side surface of the vertical connection conductor 130 may have a tapered vertical cross-sectional shape, respectively.

The semiconductor chip 120 may be disposed on the first surface of the redistribution substrate 150, and may have the connection pad 120P electrically connected to the first redistribution layer 152 of the redistribution substrate 150.

The semiconductor chip 120 may be an integrated circuit (IC) in a bare state in which no separate bump or wiring layer is formed. However, example embodiments are not limited thereto, e.g., the semiconductor chip 120 may be a packaged type IC. The IC may be formed based on a wafer. The semiconductor chip 120 may include, e.g., silicon (Si), germanium (Ge), or gallium arsenide (GaAs), and various kinds of ICs may be formed. The integrated circuit may be a processor chip such as a central processor (e.g., a central processing unit (CPU)), a graphics processor (e.g., a graphics processing unit (GPU)), a field programmable gate array (FPGA), a digital signal processor, a cryptographic processor, a microprocessor, a microcontroller, or the like, but is not limited thereto, and it may be a logic chip such as an analog-to-digital converter (ADC), an application-specific integrated circuit (ASIC), or the like, a memory chip such as a volatile memory (e.g., a dynamic random access memory (DRAM)), a non-volatile memory (e.g., a read only memory (ROM)), a flash memory, or the like, but is not limited thereto.

The connection pad 120P may electrically connect the semiconductor chip 120 with other components. The connection pad 120P may include a conductive material, e.g., aluminum (Al), but is not limited thereto.

The encapsulant 140 may be disposed on the first surface of the redistribution substrate 150, and may encapsulate at least a portion of the core member 110a, the vertical connection conductor 130, and the semiconductor chip 120. The encapsulant 140 may, e.g., completely, fill a space between the semiconductor chip 120 and the sidewall surface of first through-hole 111 and a space between the vertical connection conductor 130 and the sidewall surface of the second through-hole 112. The encapsulant 140 may cover the external side surface of the core member 110a, and thus, the core member 110a may not be exposed outside of the semiconductor package 100A. An upper surface of the encapsulant 140 may be coplanar with an upper surface of the vertical connection conductor 130 and an upper surface of the core member 110a.

In an example embodiment, a lower surface of the vertical connection conductor 130 and the lower surface of the core member 110a may be at a higher level than a lower surface of the semiconductor chip 120, e.g., relative to the redistribution substrate 150. The encapsulant 140 may cover the lower surface of the vertical connection conductor 130 and the lower surface of the core member 110a, e.g., The encapsulant 140 may be between the redistribution substrate 150 and the lower surfaces of the vertical connection conductor 130 and the lower surface of the core member 110a. The lower surface of the encapsulant 140 may be at the same level as, e.g., coplanar with, the lower surface of the semiconductor chip 120. The lower surface of the encapsulant 140 may be separated from the lower surface of the vertical connection conductor 130 and the lower surface of the core member 110a by a predetermined distance (t1).

For example, the encapsulant 140 may include an insulating material, e.g., Ajinomoto Build-up Film (ABF), but is not particularly limited thereto. In another example, the encapsulant 140 may include a thermosetting resin, e.g., an epoxy resin, a thermoplastic resin, e.g., a polyimide, or a resin in which a reinforcing material (such as an inorganic filler) is contained in the thermosetting resin or the thermoplastic resin, e.g., ABF, an FR-4 resin, a bismaleimide triazine (BT) resin, a resin, or the like. Moreover, a molding material such as an epoxy molding compound (EMC), or a photosensitive material, e.g., PID, may be used.

The redistribution substrate 150 may have a first surface and a second surface opposite each other, and the core member 110a, the vertical connection conductor 130, and the semiconductor chip 120 may be disposed on the first surface. The redistribution substrate 150 may further include the first redistribution layer 152 electrically connecting the connection pad 120P of the semiconductor chip 120 and the vertical connection conductor 130, and an insulating layer 151 between the first redistribution layer 152 and the lower surfaces of the encapsulant 140 and the semiconductor chip 120.

In an example embodiment, the encapsulant 140 may have a first via hole 140h opening, e.g., exposing, a portion of the lower surface of the vertical connection conductor 130, and a portion of the insulating layer 151 of the redistribution substrate 150 may be disposed in the first via hole 140h. The insulating layer 151 may have a second via hole 151h opening, e.g., exposing, a portion of the lower surface of the vertical connection conductor 130 in the first via hole 140h, such that a redistribution via 153 filling the second via hole 151h may connect the first redistribution layer 152 to the vertical connection conductor 130 through the insulating layer 151. Here, sidewall surfaces of the first and second via holes 140h and 151h may be spaced apart from each other along the X direction, e.g., the second via hole 151h may be narrower than the first via hole 140h and centered in the first via hole 140h.

The redistribution substrate 150 may redistribute the connection pad 120P of the semiconductor chip 120, and may include a plurality of first insulating layers 151, a plurality of first redistribution layers 152, and a plurality of first redistribution vias 153. The first insulating layer 151 may include an insulating material, e.g., a photosensitive insulating material such as PID. In this case, since a fine pitch by a photolithography process may be implemented, the connection pad 120P of the semiconductor chip 120 can be effectively redistributed. However, the insulating material included in the first insulating layer 151 is not limited thereto, and may include other types of insulating materials. The first insulating layer 151 may include the same insulating material as the encapsulant 140 or may include other types of insulating materials.

The first redistribution layer 152 may include a conductive material, e.g., copper (Cu), aluminum (Al), silver (Ag), tin (Sn), gold (Au), nickel (Ni), lead (Pb), titanium (Ti), or alloys thereof. The redistribution layer 152 may perform various functions depending on the design. For example, the redistribution layer 152 may include a ground (GND) pattern, a power (PWR) pattern, and a signal (S) pattern. The signal(S) pattern may transfer various signals except for the ground pattern (GND) pattern, and the power (PWR) pattern such as a data signal.

The first redistribution via 153 may electrically connect the redistribution layers 152 of different levels to each other, and in addition, the first redistribution via 153 may electrically connect the connection pad 120P and the vertical connection conductor 130 to the first redistribution layer 152. The first redistribution via 153 may be directly connected to the connection pad 120P of the semiconductor chip 120, but is not limited thereto, and may be connected to the connection pad 120P through a solder or a metal pillar. The first redistribution via 153 may include a conductive material, e.g., copper (Cu), aluminum (Al), silver (Ag), tin (Sn), gold (Au), nickel (Ni), lead (Pb), titanium (Ti), or alloys thereof. The first redistribution via 153 may be a filled via completely filled with a conductive material, or may be a conformal via in which a conductive material is disposed along a wall surface of a via hole. The first redistribution via 153 may have, e.g., a tapered shape, an hourglass shape, or a cylindrical shape. The first redistribution via 153 may be integrated with the first redistribution layer 152, but is not limited thereto.

The redistribution member 160 (i.e., a rear redistribution member) may be on the core member 110a, e.g., the core member 110a may be between the redistribution substrate 150 and the redistribution member 160. The redistribution member 160 may include a second insulating layer 161 on the core member 110a, i.e., on a plane (S1 in FIG. 7C) in which the upper surface of the encapsulant 140, the upper surface of the core member 110a, and the upper surfaces of the vertical connection conductor 130 are connected. The redistribution member 160 may further include a second redistribution layer 162 on the second insulating layer 161, and a second redistribution via 163 penetrating the second insulating layer 161 and connecting the second redistribution layer 162 and the vertical connection conductor 130. The redistribution member 160 may include a plurality of second insulating layers 161, a plurality of second redistribution layer 162, and a plurality of second redistribution vias 163.

The second insulating layer 161 may include an insulating material, e.g., a photosensitive insulating material such as PID. In this case, a fine pitch by a photolithography process may be implemented. However, the insulating material included in the second insulating layer 161 is not limited thereto, and may include other types of insulating materials, e.g., the second insulating layer 161 may include the same insulating material as the first insulating layer 151 of the redistribution substrate 150 or may include other types of insulating materials.

At least a portion of the second redistribution layer 162 may be exposed from an upper portion of the semiconductor package 100A, and the second redistribution layer 162 may be physically/electrically coupled to other electronic components provided outside of the semiconductor package 100A. The second redistribution layer 162 may include a conductive material, e.g., copper (Cu), aluminum (Al), silver (Ag), tin (Sn), gold (Au), nickel (Ni), lead (Pb), titanium (Ti), or alloys thereof. The second redistribution layer 162 may perform various functions depending on the design. For example, the second redistribution layer 162 may include a ground (GND) pattern, a power (PWR) pattern, and a signal (S) pattern.

The second redistribution via 163 may electrically connect the second redistribution layer 162 to the vertical connection conductor 130. The second redistribution via 163 may include a conductive material, e.g., copper (Cu), aluminum (Al), silver (Ag), tin (Sn), gold (Au), nickel (Ni), lead (Pb), titanium (Ti), or alloys thereof. The second redistribution via 163 may be a filled via completely filled with a conductive material, or may be a conformal via in which a conductive material is disposed along a wall surface of a via hole. The second redistribution via 163 may have, e.g., a tapered shape, an hourglass shape, or a cylindrical shape. The second redistribution via 163 may be integrated with the second redistribution layer 162, but is not limited thereto.

The passivation layers 170-1 and 170-2 may include a first passivation layer 170-1 disposed on the redistribution substrate 150 and a second passivation layer 170-2 disposed on the redistribution member 160. The first passivation layer 170-1 may be disposed on the second surface of the redistribution substrate 150, and may have an opening exposing a portion of the first redistribution layer 152. The second passivation layer 170-2 may be disposed on the upper surface of the redistribution member 160, and may have an opening exposing a portion of the second redistribution layer 162. The passivation layers 170-1 and 170-2 may include an insulating material, e.g., ABF, but are not limited thereto, and may include other types of insulating materials.

The underbump metal 180 may be disposed in the opening of the first passivation layer 170-1, and may be electrically connected to a portion of the first redistribution layer 152 exposed by the opening of the first passivation layer 170-1. The underbump metal 180 may improve connection reliability of a connection bump 190 and board level reliability of the semiconductor package 100A. The underbump metal 180 may be formed by a metallization method using metal, but is not limited thereto.

The connection bump 190 may be disposed on the first passivation layer 170-1, and may be electrically connected to the first redistribution layer 152 through the underbump metal 180. The connection bump 190 may physically/electrically connect the semiconductor package 100A externally. The connection bump 190 may include a low melting point metal, e.g., tin (Sn), or an alloy (Sn—Ag—Cu) containing tin (Sn). The connection bump 190 may be a land, a ball, or a pin. The connection bump 190 may include a copper pillar or a solder. At least one of the connection bumps 190 may be disposed in a fan-out region. The fan-out region means a region that does not overlap with a region where the semiconductor chip 120 is disposed.

Figure 3A:
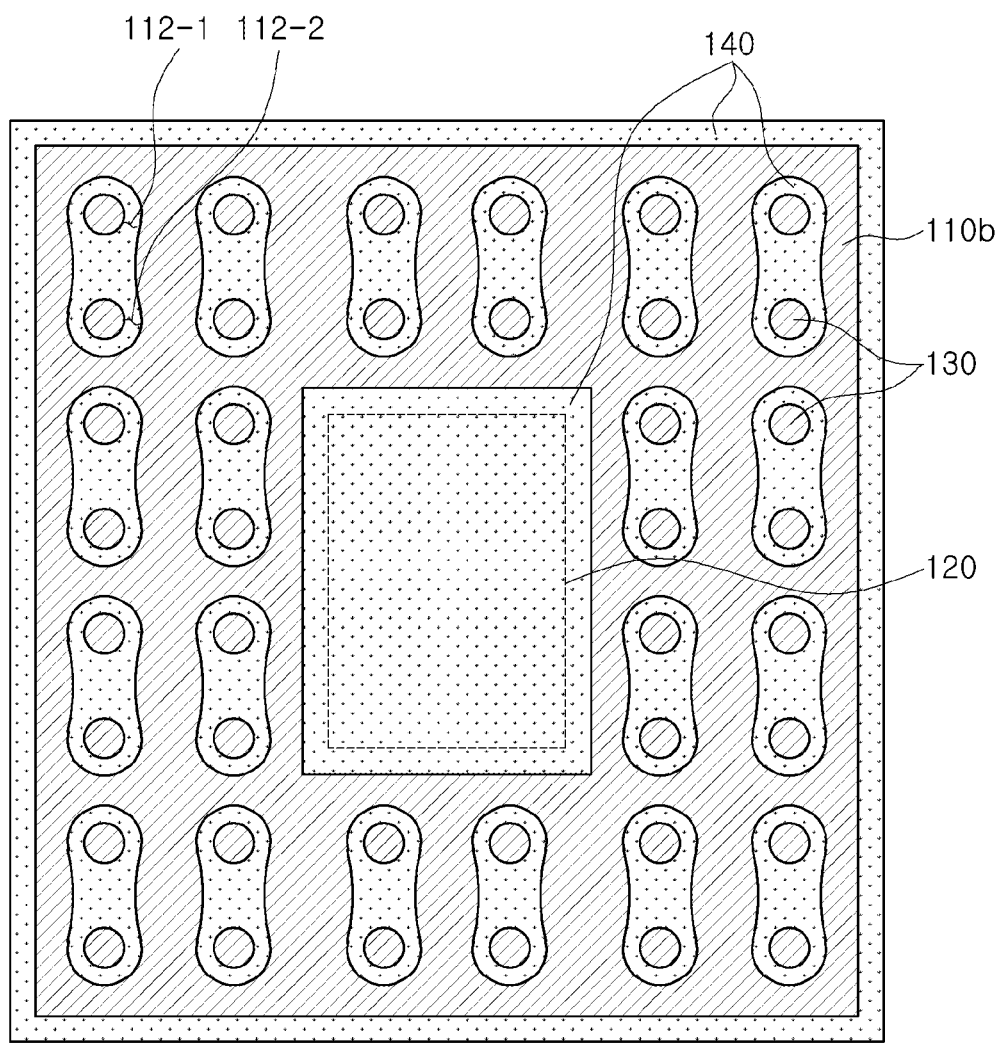
FIGS. 3A to 3B are plan views showing other example embodiments of some components of the package of FIG. 1.
Figure 3B:
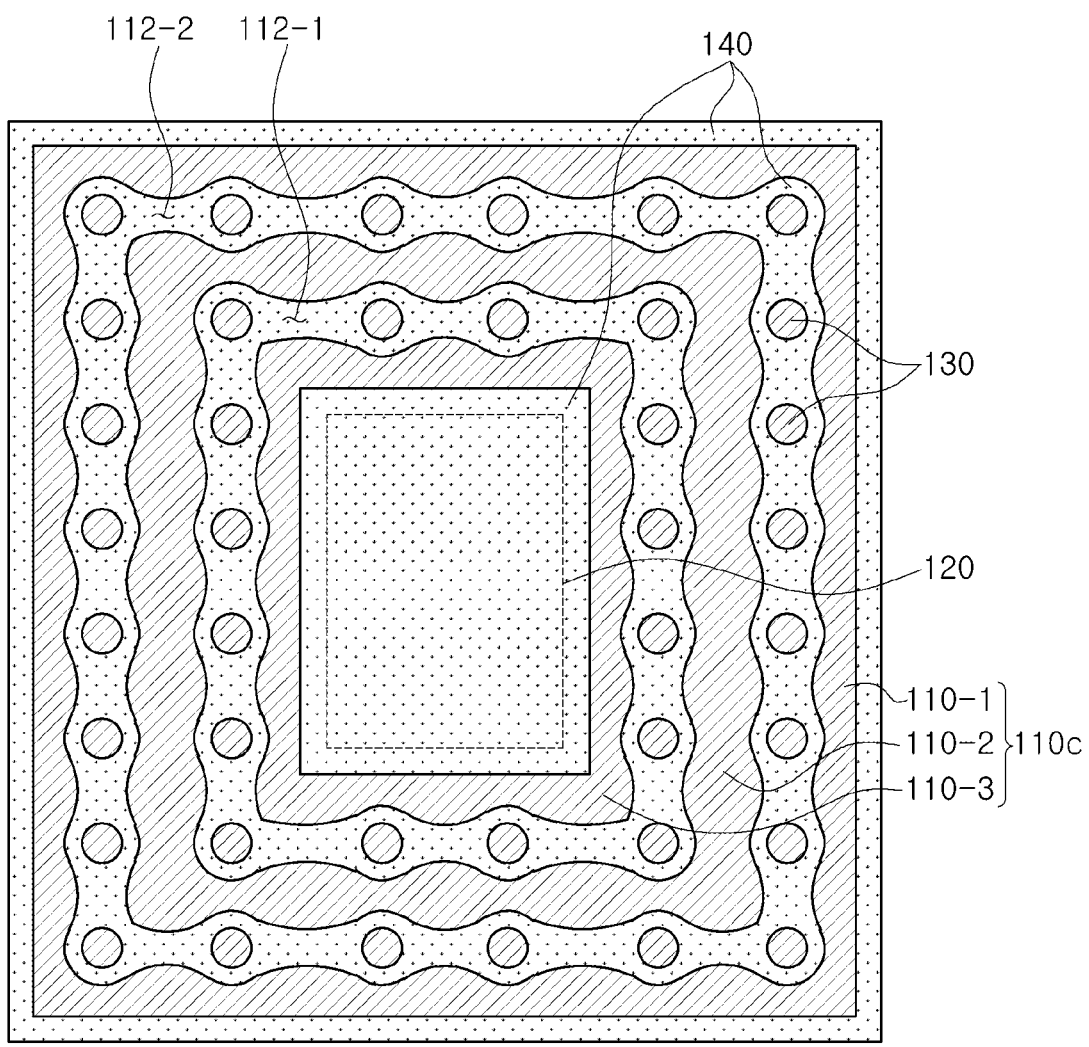

FIGS. 3A to 3B are plan views illustrating other example embodiments of core members in the semiconductor package 100A of FIG. 1.

Referring to FIG. 3A, a core member 110b according to another example embodiment may have a plurality of second through-holes accommodating the plurality of vertical connection conductors 130, respectively. The second through-holes in the core member 110b may include pairs of through-holes 112-1 and 112-2 disposed adjacently to each other among the plurality of second through-holes, and may be connected to each other. For example, as illustrated in FIG. 3A, each pair of through-holes 112-1 and 112-2 may be connected to each other, while being spaced apart from adjacent pairs of second through-holes. Therefore, the core member 110b does not exist between the vertical connection conductors 130 disposed inside the pair of through-holes 112-1 and 112-2 connected to each other, e.g., a portion of the core member 110b may be removed between the vertical connection conductors 130 in the connected pair of through-holes 112-1 and 112-2, and the encapsulant 140 may be filled therein between the vertical connection conductors 130. The pairs of through-holes 112-1 and 112-2 connected to each other may secure sufficient space between the vertical connection conductors 130 to prevent occurrence of voids in a process of embedding the encapsulant 140.

Referring to FIG. 3B, a core member 110c of another example embodiment may include first to third core members 110-1, 110-2 and 110-3 spaced apart from each other, e.g., the first to third core members 110-1, 110-2 and 110-3 may be arranged concentrically as viewed in a top view. The plurality of second through-holes in the core member 110c may be connected to each other to form a first group 112-1' separating the third core member 110-3 and the second core member 110-2, and a second group 112-2' separating the second core member 110-2 and the first core member 110-1. The first to third core members 110-1, 110-2, and 110-3 spaced apart from each other may perform different functions from each other. For example, the first and second core members 110-1 and 110-2 may be connected to the ground pattern, and the third core member 110-3 may be connected to the power pattern.

Meanwhile, since the technical features of the components having the same reference numerals as in FIG. 1 among the components illustrated in FIGS. 3A and 3B are similar to those of the components illustrated in FIG. 1, descriptions thereof will be omitted.

Figure 4A:
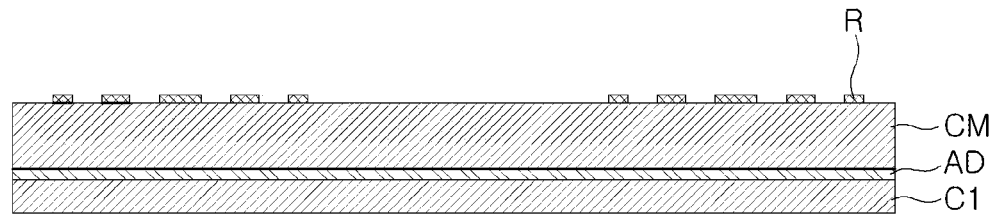
FIGS. 4A, 4B, and 5A to 8B are cross-sectional views of stages in a method of manufacturing the package of FIG. 1.
Figure 4B:
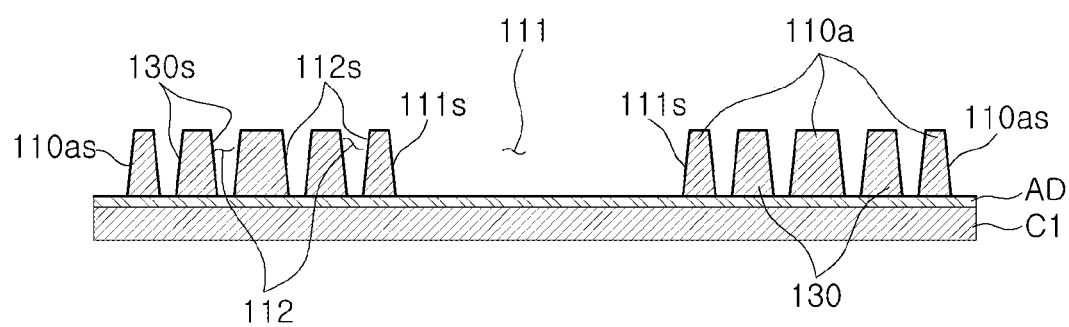

FIGS. 4A, 4B, and 5A to 8B are cross-sectional views illustrating stages in a method of manufacturing the semiconductor package 100A of FIG. 1, and FIGS. 4C to 4E are cross-sectional views illustrating other example embodiments of stages of forming a core member and a vertical connection conductor corresponding to the stage of FIG. 4B.

Referring to FIG. 4A, an adhesive layer AD and a metal plate CM may be formed on a first carrier C1, such that the adhesive layer AD is between the metal plate CM and the first carrier C1. Next, a patterned etching resist R (e.g., a photoresist) may be formed on the metal plate CM, such that the patterned etching resist R corresponds to the core member 110a and the vertical connection conductor 130 to be formed in the metal plate CM.

Referring to FIG. 4B, the first and second through-holes 111 and 112 may be etched through the metal plate CM using the patterned etching resist R as a mask, such that the core member 110a and the vertical connection conductor 130 are formed in the metal plate CM. In other words, the core member 110a and the vertical connection conductor 130 are formed simultaneously through the same metal plate CM. The core member 110a having the first and second through-holes 111 and 112 and the vertical connection conductor 130 located in the second through-hole 112 may be formed by etching the metal plate CM with the adhesive layer AD as the stopper layer. Accordingly, an external side surface 110as of the core member 110a may have a cross-section tapered toward the upper surface of the core member 110a, and a side surface 130s of the vertical connection conductor 130 may have a cross-section tapered toward the upper surface thereof. In addition, first and second sidewall surfaces 111s and 112s of each of the first and second through-holes 111 and 112 may have a tapered cross-section toward a lower end of the through-holes 111 and 112. Here, an upper surface and a lower surface, an upper end and a lower end are a term used to describe a taper direction of the side surfaces formed by etching based on the drawings. Thereafter, when the upper and lower of the core member 110a is reversed in the process of manufacturing the package, the above-described "upper surface" may be described as "lower surface" and the above-described "upper end" may be described as "lower end" based on the corresponding drawing.

The metal plate CM may be a copper plate having a significant thickness to the thickness of the semiconductor chip, e.g., the thickness of the metal plate CM may be larger than that of the semiconductor chip 200. The material of the first carrier C1 and the adhesive layer AD may include any suitable material. For example, the first carrier C1 may include a metal material, e.g., copper (Cu), and the adhesive layer AD may include a metal material, e.g., nickel (Ni). In another example, the first carrier C1 and the adhesive layer AD may include an organic material other than a metallic material. However, when the first carrier C1 and the adhesive layer AD include a metal material, the adhesive layer AD may include a metal material different from the metal plate CM. Therefore, the adhesive layer AD may serve as an etching stopper for the metal plate CM, and when the adhesive layer AD is then etched, damage to the core member 110a may be prevented or substantially minimized. For example, the first carrier C1, the adhesive layer AD, and the metal plate CM may include copper, nickel, and copper, respectively, and may be formed by a rolling process.

Figure 4C:
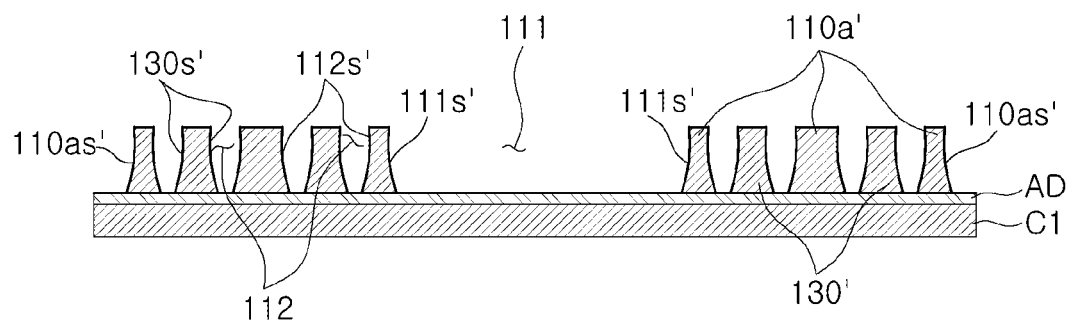
FIGS. 4C to 4E are cross-sectional views showing other example embodiments of some components of the package of FIG. 1.

Referring to FIG. 4C, in another example, first and second inner side surfaces 111s' and 112s' and an external side surface 110as of a core member 110a' may have a concave vertical cross-sectional shape. A side surface 130s' of a vertical connection conductor 130' may have a concave vertical cross-sectional shape. Therefore, the first inner side surface 111s' of the first through-hole 111 may have a vertical cross-sectional shape that is convex with respect to a center line of the first through-hole 111, and the second inner side surface 112s' may have a vertical cross-sectional shape that is convex with respect to a center line of the second through-hole 112.

Figure 4D:
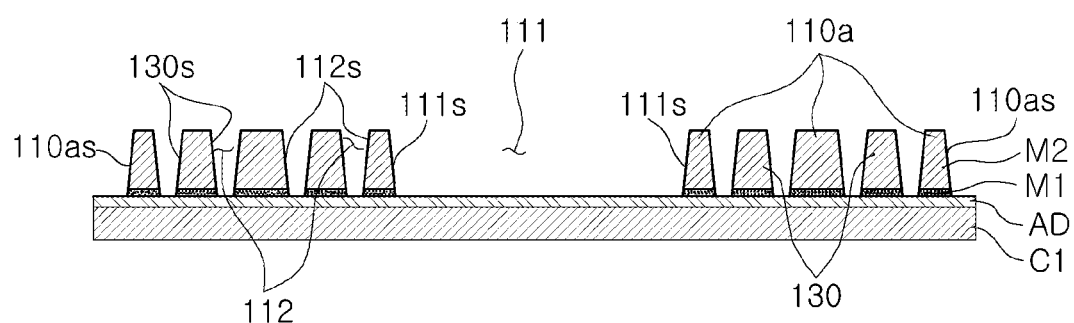
Figure 4E:
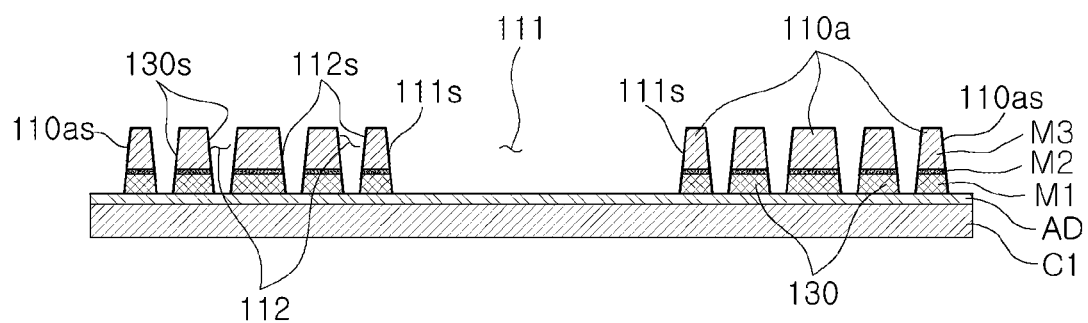

Referring to FIGS. 4D to 4E, in yet another example, the core member 110a and the vertical connection conductor 130 may include a plurality of metal layers (M1, M2, M3). The plurality of metal layers (M1, M2, M3) may include different metal materials.

For example, as illustrated in FIG. 4D, each of the core member 110a and the vertical connection conductor 130 may include a first metal layer M1 and a second metal layer M2, respectively. When the second metal layer M2 includes copper, the first metal layer M1 may include other metal materials, e.g., aluminum (Al), silver (Ag), and tin (Sn), gold (Au), nickel (Ni), lead (Pb), titanium (Ti), or alloys thereof In this case, the first metal layer M1 may have a thickness of 200 nm or less.

In another example, as illustrated in FIG. 4E, each of the core member 110a and the vertical connection conductor 130 may include a first metal layer M1, a second metal layer M2, and a third metal layer M3, respectively. In this case, the first metal layer M1 may have a thickness of 1 μm or less, and the second metal layer M2 may have a thickness of 200 nm or less.

Figure 5A:
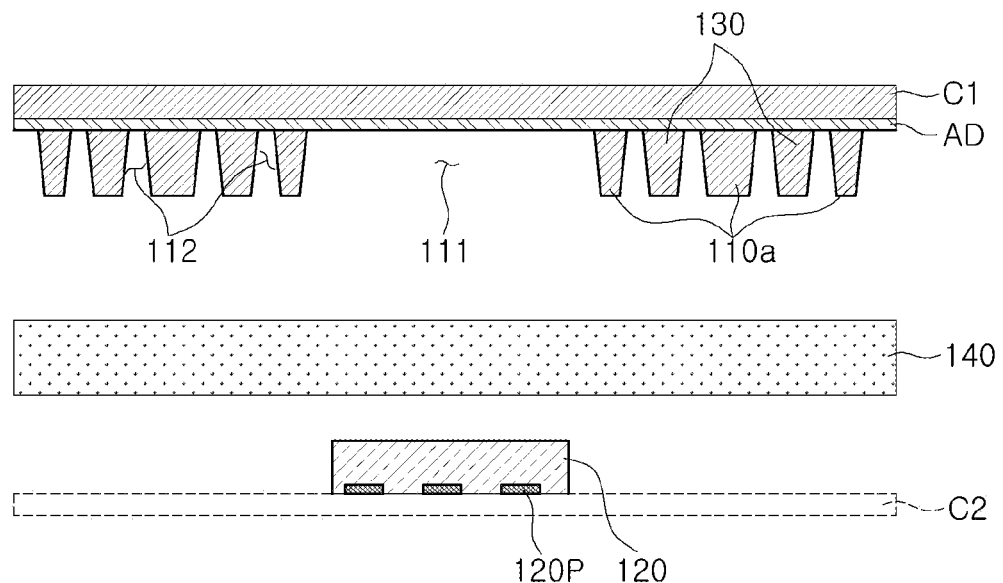
Figure 5B:
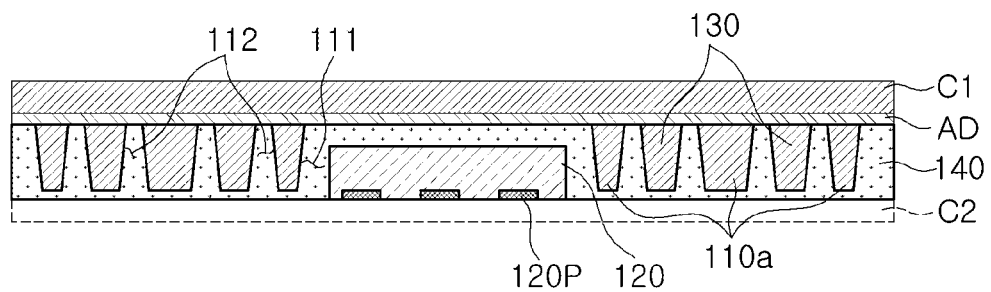

Referring to FIGS. 5A and 5B, the semiconductor chip 120 may be disposed in the first through-hole 111 of the core member 110a, and the encapsulant 140 encapsulating the semiconductor chip 120 and the core member 110a may be formed. The encapsulant 140 may be formed by compressing the core member 110a (in which the first and second through-holes 111 and 112 are formed) and the vertical connection conductor 130 on one surface of the encapsulant 140, and compressing the semiconductor chip 120 disposed on a second carrier C2 on the other surface of the encapsulant 140, while heating the encapsulant 140. The encapsulant 140 may be an ABF. Since the vertical connection conductor 130 and the core member 110a are embedded in the encapsulant 140 in a state attached to the first carrier C1, the upper surface of the vertical connection conductor 130, the upper surface of the core member 110a, and the upper surface of the encapsulant 140 may be on the same plane with each other, e.g., along the adhesive layer AD. Thereafter, the second carrier C2 may be removed and a redistribution substrate may be formed.

Figure 6A:
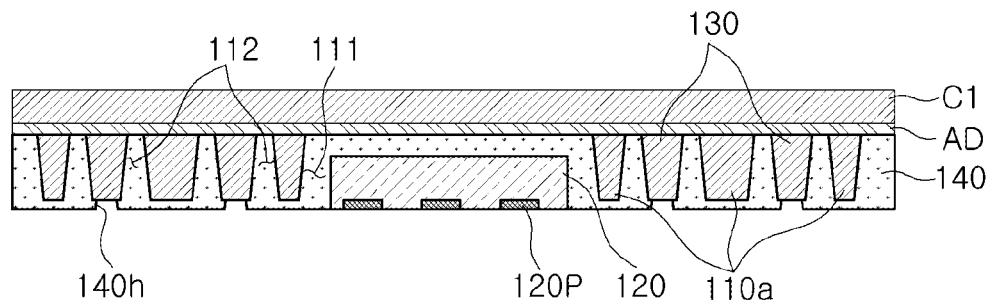
Figure 6B:
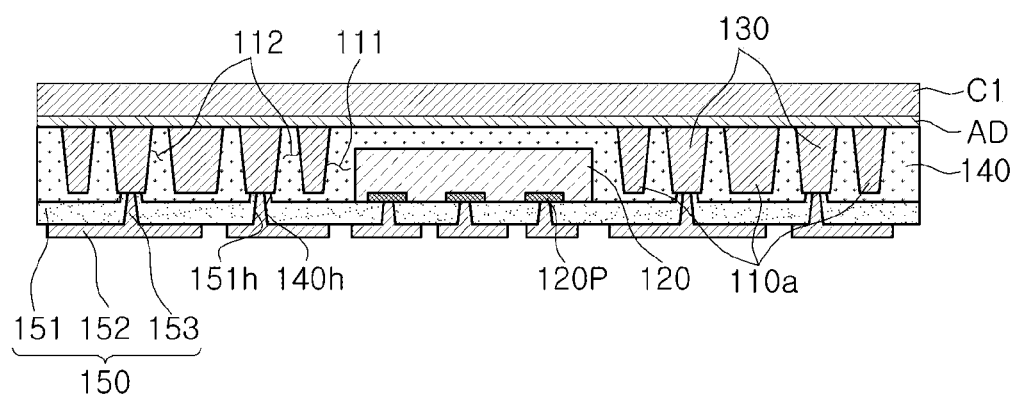
Figure 6C:
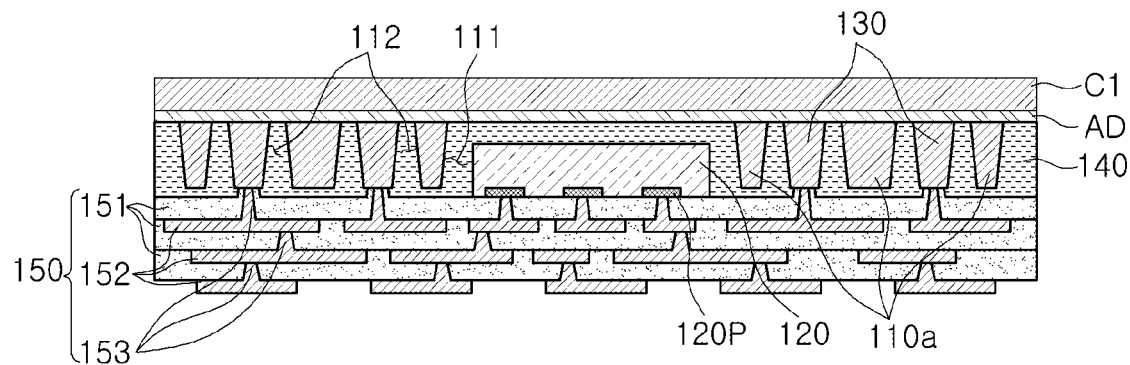

Referring to FIGS. 6A to 6C, the redistribution substrate 150 may be formed on the lower surface of the semiconductor chip 120.

In detail, the second carrier C2 of FIG. 5B may be removed, and the first via hole 140h penetrating the encapsulant 140 covering the lower surface of the vertical connection conductor 130 may be formed. The first insulating layer 151 covering the lower surface of the semiconductor chip 120 and the lower surface of the encapsulant 140 and filling the first via hole 140h may be formed, and the second via hole 151h penetrating the first insulating layer 151 and opening a portion of the lower surface of the vertical connection conductor 130 in the first via hole 140h may be formed. The first redistribution via 153 filling the second via hole 151h and the first redistribution layer 152 on the first insulating layer 151 may be formed. The first via hole 140h may be formed by a laser drill method, and the second via hole 151h may be formed by a photolithography process. The first redistribution layer 152 and the first redistribution via 153 may be formed by a plating process. By repeating the photolithography process and the plating process, the redistribution substrate 150 including a plurality of insulating layers 151, a plurality of redistribution layers 152, and a plurality of redistribution vias 153 may be formed.

Figure 7A:
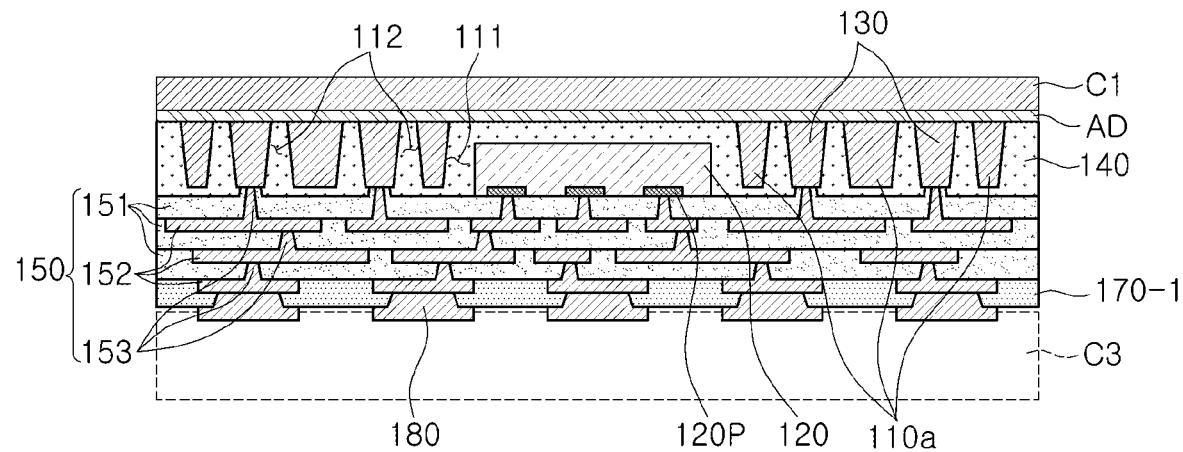
Figure 7B:
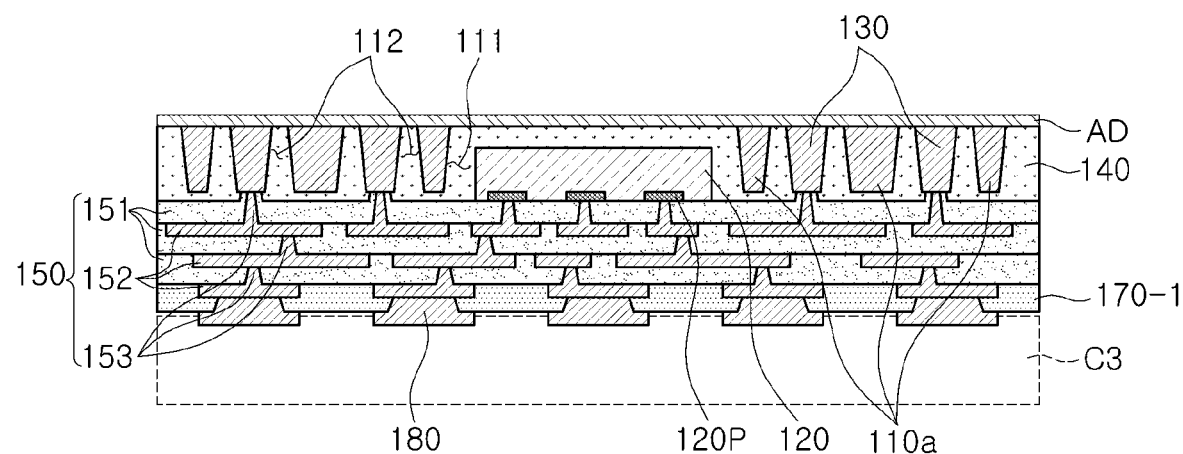
Figure 7C:
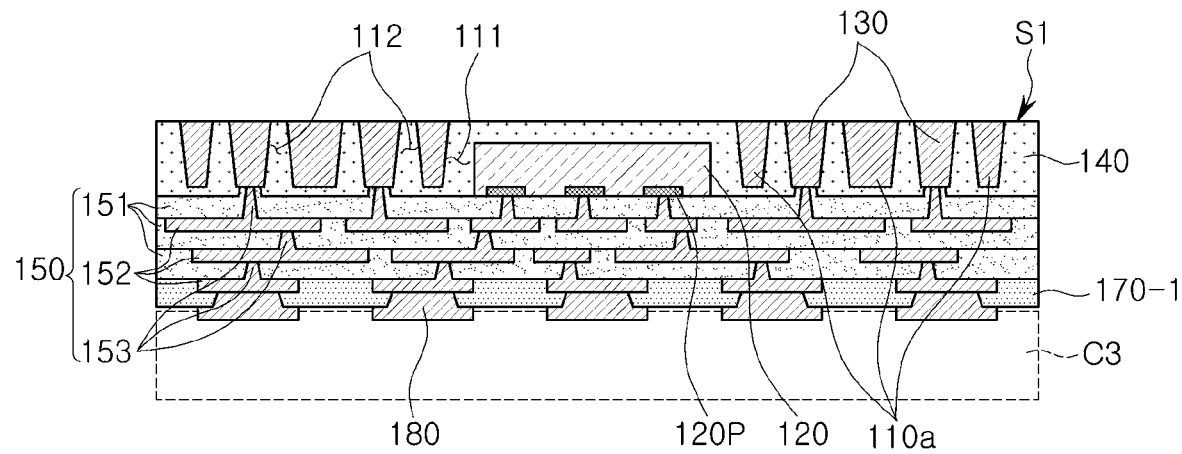

Referring to FIGS. 7A to 7C, the upper surface of the encapsulant 140 may be exposed by removing the first carrier C1 and the adhesive layer AD. The first passivation layer 170-1 and the underbump metal 180 may be formed below the redistribution substrate 150, and a surface on which the underbump metal 180 is formed may be attached to the third carrier C3. The first passivation layer 170-1 may be a solder resist. The first carrier C1 can be removed by etching using an alkaline chemical. The adhesive layer AD may be removed by etching using a chemical containing nitric acid. The adhesive layer AD may not be corroded during the etching process of the first carrier C1, and the core member 110a and the vertical connection conductor 130 may not be corroded during the etching process of the adhesive layer AD. The upper surface of the encapsulant 140 exposed by removing the adhesive layer AD may be on the same plane S1 as the upper surface of the core member 110a and the upper surface of the vertical connection conductor 130.

Figure 8A:
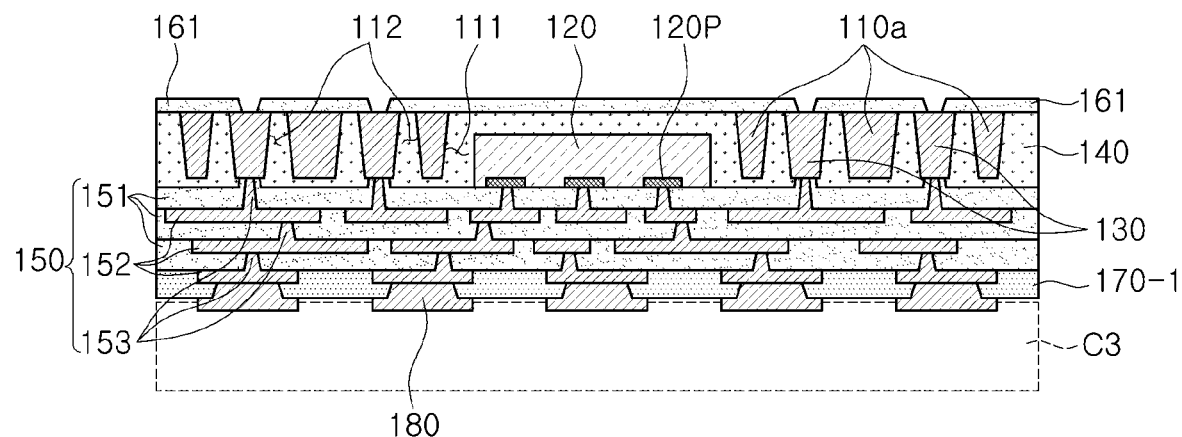
Figure 8B:
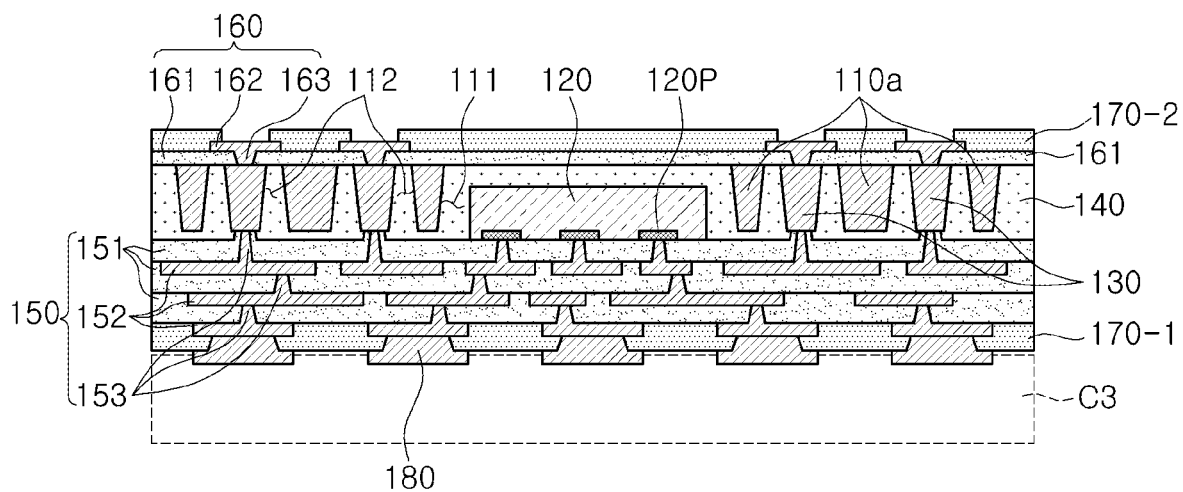

Referring to FIGS. 8A to 8B, the redistribution member 160 may be formed. The second insulating layer 161 may be formed on the exposed plane S1 in FIG. 7C and a via hole opening a portion of the upper surface of the vertical connection conductor 130 may be formed. The via hole can be formed by a photolithography process. The second redistribution layer 162 and the second redistribution via 163 may be formed on the via hole. The second redistribution layer 162 and the second redistribution via 163 may be formed by a plating process. The second passivation layer 170-2 having an opening exposing a portion of the second redistribution layer 162 may be formed on the redistribution member 160. The second passivation layer 170-2 may be a solder resist. Thereafter, the third carrier C3 may be removed and a connection bump covering the underbump metal 180 may be formed to complete the semiconductor package.

Figure 9:
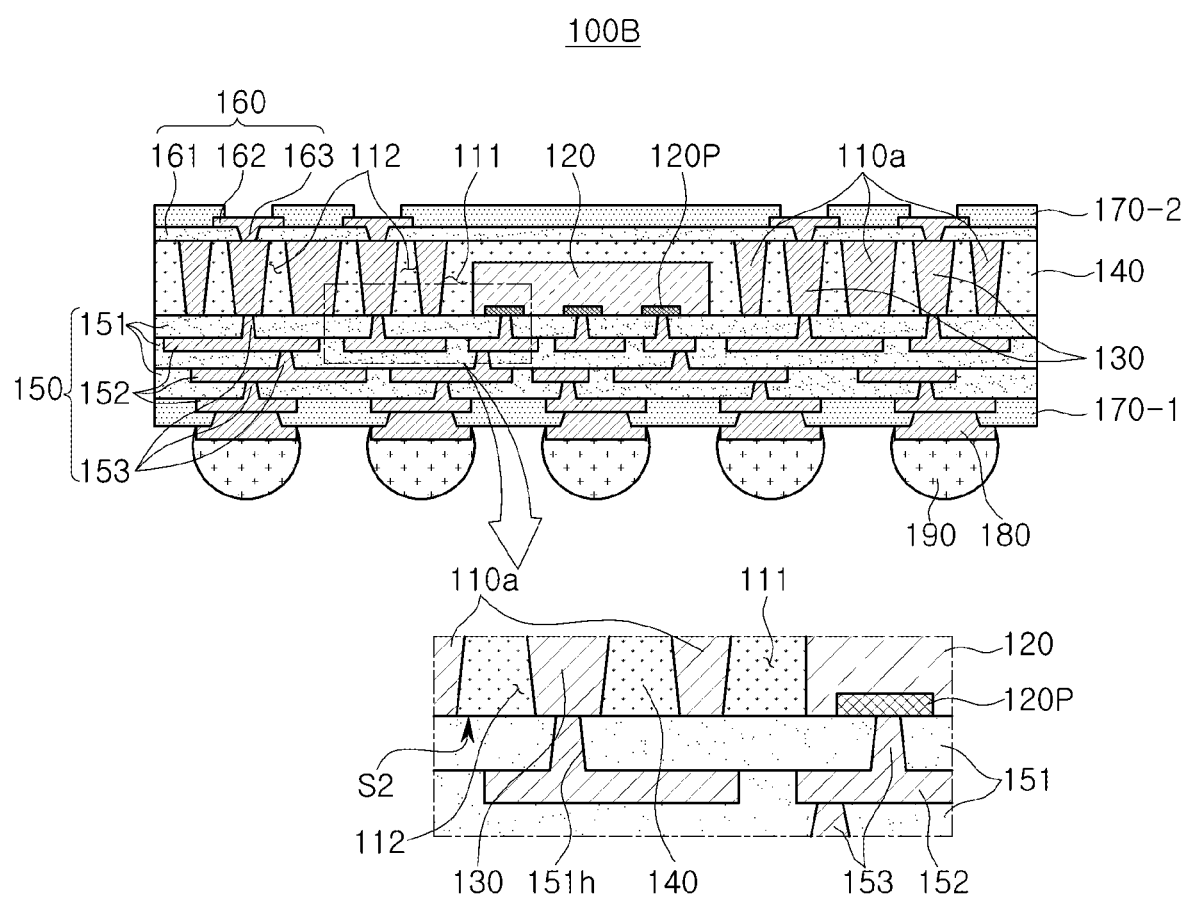
FIGS. 9 to 10B are cross-sectional views schematically illustrating a portion of a semiconductor package and a method of manufacturing the same according to another example embodiment.
Figure 10A:
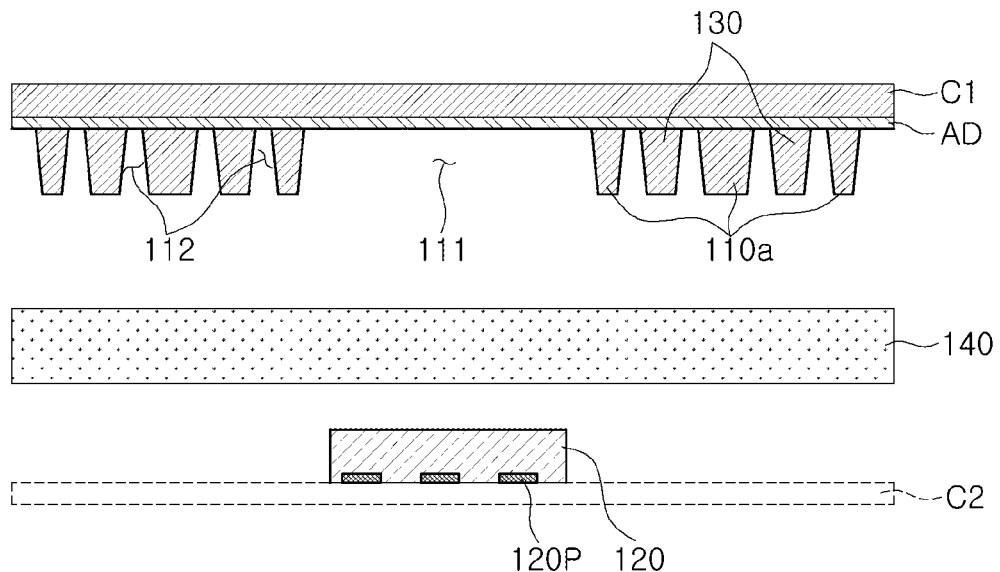
Figure 10B:
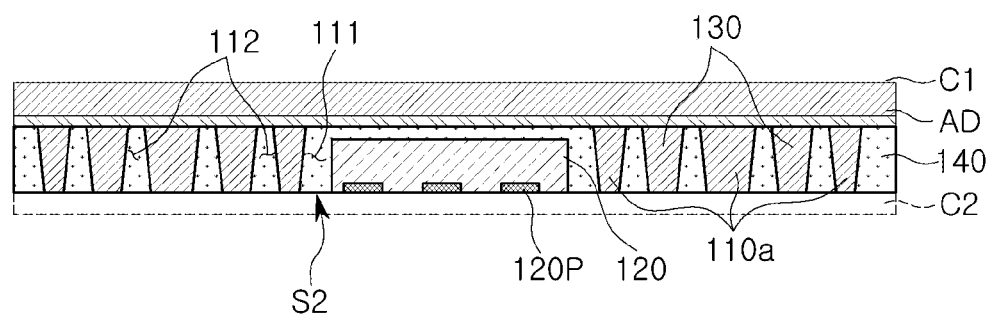

FIGS. 9 to 10B are cross-sectional views schematically illustrating a portion of a semiconductor package 100B and a method of manufacturing the same according to another example embodiment.

Referring to FIG. 9, in the semiconductor package 100B, the lower surface of the encapsulant 140 may be on the same plane S2 as the lower surface of the vertical connection conductor 130 and the lower surface of the core member 110a, and the redistribution substrate 150 may include the insulating layer 151 on the same plane S2. The redistribution via 153 penetrating the insulating layer 151 and connecting the first redistribution layer 152 to the vertical connection conductor 130 may have an upper surface coplanar with the plane S2.

Referring to FIGS. 10A and 10B, a lower surface of the core member 110a and a lower surface of the vertical connection conductor 130 may be in close contact with a surface of the second carrier C2 in a process of forming the encapsulant 140 similar to FIGS. 5A and 5B. That is, as compared to the process in FIGS. 5A and 5B, the core member 110a and the vertical connection conductor 130 may be pushed, e.g., pressed, against, e.g., through, the encapsulant 140 until the lower surfaces of the core member 110a and the vertical connection conductor 130 contact the second carrier C2. Therefore, the lower surface of the encapsulant 140 may be on the same plane S2 as the lower surface of the vertical connection conductor 130 and the lower surface of the core member 110a. Therefore, a process of forming a laser via (i.e., via hole 140h in FIG. 6A) penetrating the encapsulant 140 can be omitted and a vertical connection path can be shortened.

Meanwhile, the technical features of the components having the same reference numerals as in FIG. 1 among the components illustrated in FIGS. 9 to 10B are similar to those of the components illustrated in FIG. 1, and thus descriptions thereof will be omitted.

Figure 11:
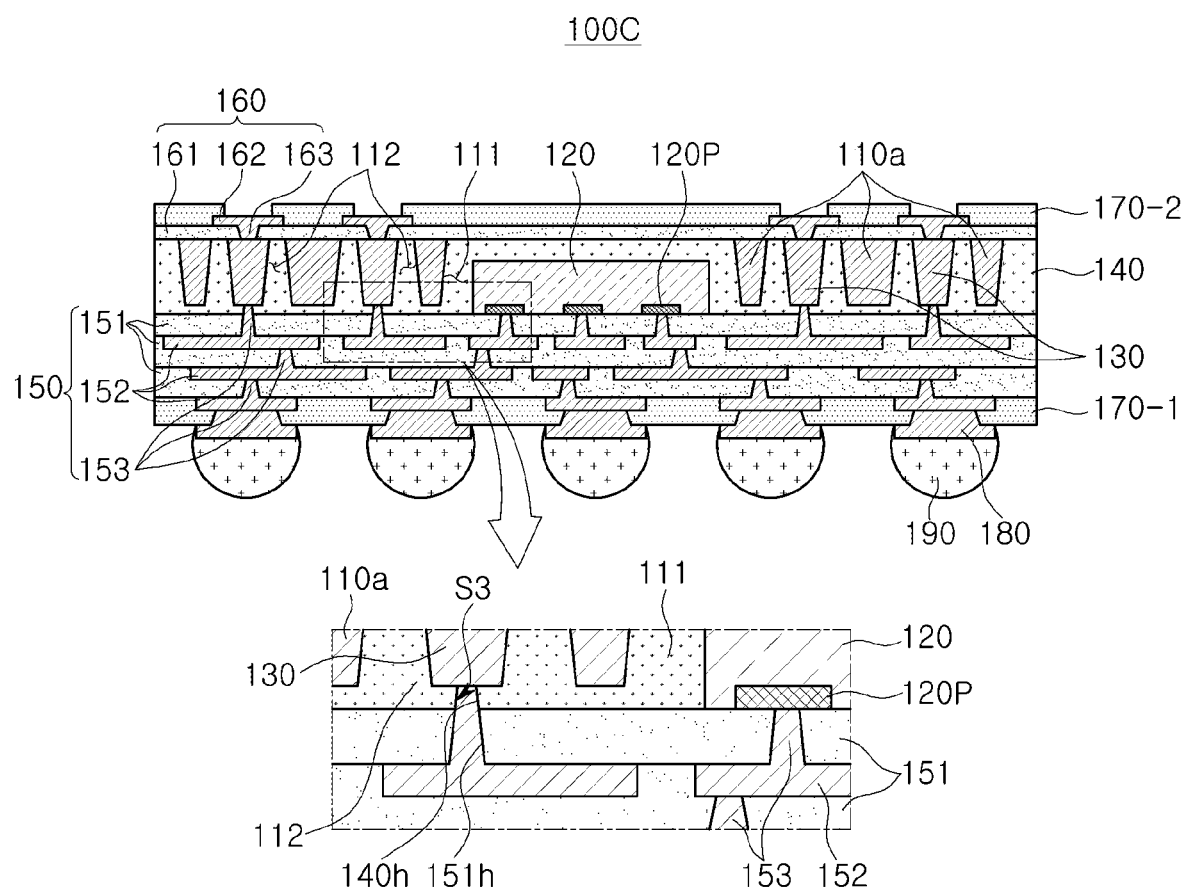
FIGS. 11 to 12C are cross-sectional views schematically illustrating a portion of a semiconductor package and a method of manufacturing the same according to another embodiment.
Figure 12A:
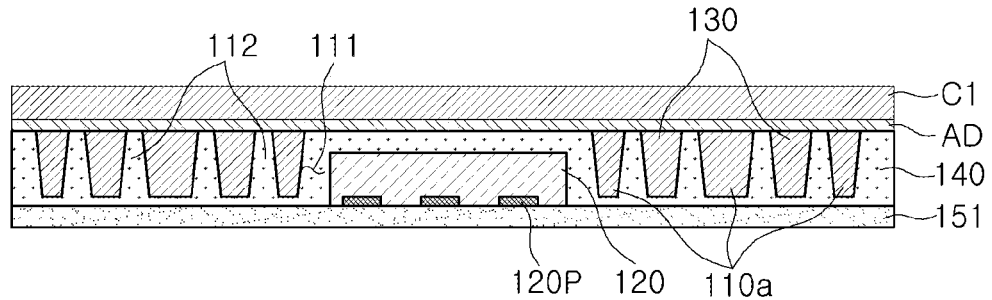
Figure 12B:
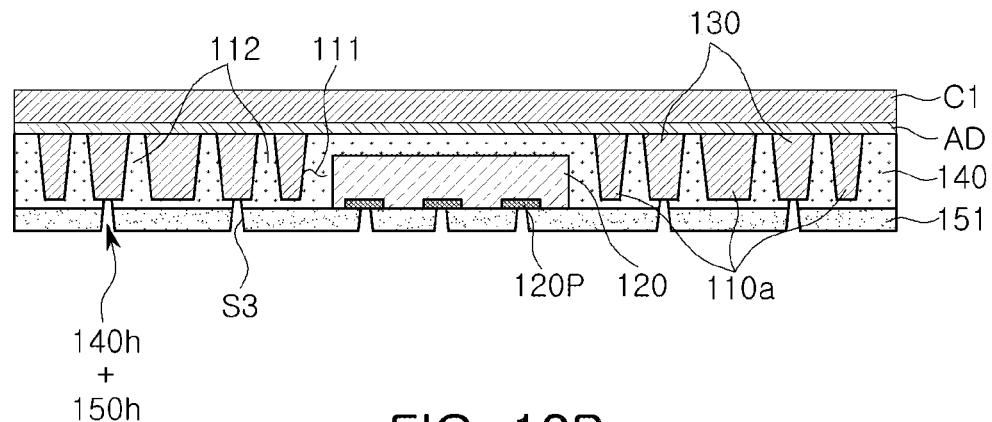
Figure 12C:
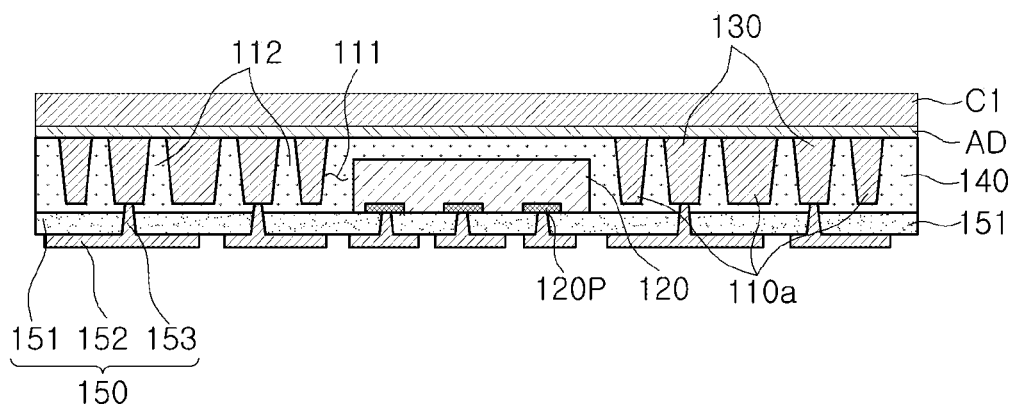

FIGS. 11 to 12C are cross-sectional views schematically illustrating a portion of a semiconductor package 100C and a method of manufacturing the same according to another example embodiment.

Referring to FIG. 11, in the semiconductor package 100C, the encapsulant 140 may include the first via hole 140h opening a portion of the lower surface of the vertical connection conductor 130, and the redistribution substrate 150 is disposed on the lower surface of the encapsulant 140 and the lower surface of the semiconductor chip 120, and includes the first insulating layer 151 having the second via hole 151h connected to the first via hole 140h, the first redistribution layer 152 on the first insulating layer 151, and the redistribution via 153 filling the first and second via holes 140h and 151h and connecting the first redistribution layer 152 to the vertical connection conductor 130, and sidewall surfaces of the first and second via holes 140h and 151h may be on the same plane S3. The encapsulant 140 may include the same material as the first insulating layer 151. For example, the encapsulant 140 and the first insulating layer 151 may both include a PID resin. Therefore, a process of forming a laser via (i.e., via hole 140h in FIG. 6A) penetrating the encapsulant 140 by simultaneously forming the first via hole 140h and the second via hole 151h may be omitted.

Referring to FIGS. 12A to 12C, the redistribution substrate 150 may be formed similarly to FIGS. 6A to 6C. However, since the encapsulant 140 and the first insulating layer 151 include the same insulating material, the first via hole 140h penetrating the encapsulant 140 and the second via hole 151h penetrating the first insulating layer 151 may be formed by the same process. When both the encapsulant 140 and the first insulating layer 151 include a PID resin, the first via hole 140h and the second via hole 151h may be photo vias connected as one, and the sidewall surfaces of the second via holes 140h and 151h may be on the same plane S3.

Meanwhile, the technical features of the components having the same reference numerals as in FIG. 1 among the components illustrated in FIGS. 9 to 10B are similar to those of the components illustrated in FIG. 1, and thus descriptions thereof will be omitted.

Figure 13:
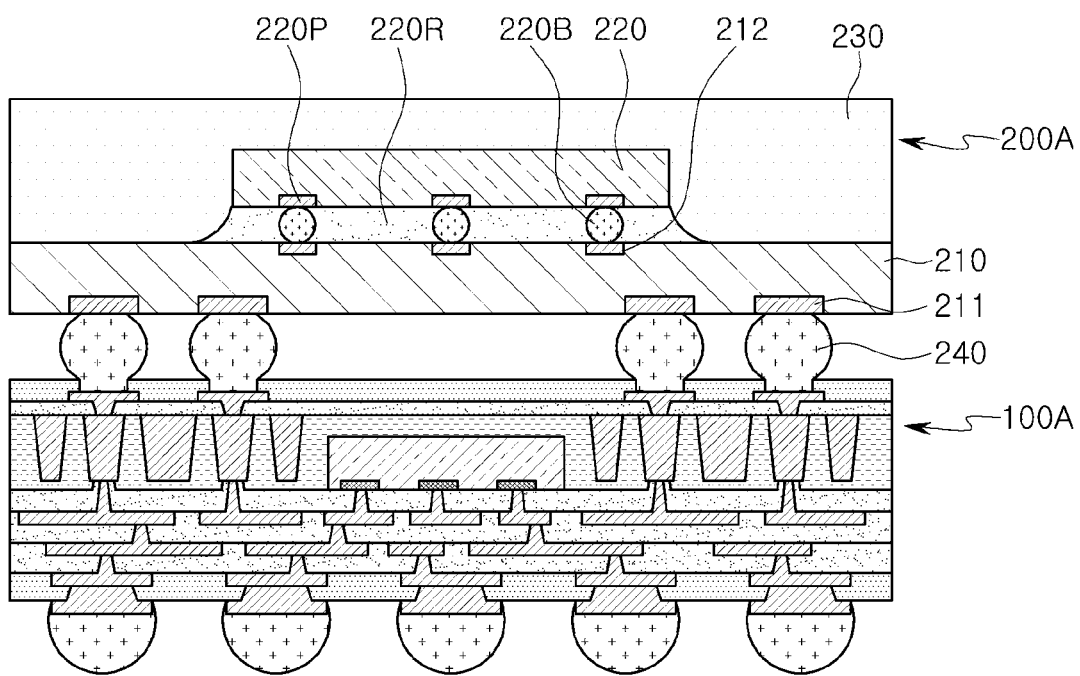
FIG. 13 is a cross-sectional view showing a semiconductor package according to another example embodiment.

FIG. 13 is a cross-sectional view showing a semiconductor package 300 according to another example embodiment.

Referring to FIG. 13, a semiconductor package 300 may have a package-on-package structure in which a second semiconductor package 200A is coupled to the semiconductor package 100A of FIG. 1. The second semiconductor package 200A may include a second redistribution substrate 210, a second semiconductor chip 220, and a second encapsulant 230.

The second redistribution substrate 210 may include redistribution pads 211 and 212 which may be electrically connected externally on the lower surface and the upper surface, respectively, and may include redistribution patterns connected to the redistribution pads 211 and 212 therein. The redistribution patterns may redistribute a connection pad of the second semiconductor chip 220 to the fan-out region.

The second semiconductor chip 220 may include a connection pad 220P connected to an integrated circuit therein, and the connection pad 220P may be electrically connected to the second redistribution substrate 210 by a connection bump 220B. For example, as illustrated in FIG. 13, the second semiconductor package 200A may further include an underfill material 220R surrounding the connection bump 220B.

The underfill material 220R may be an insulating material including epoxy resin, or the like. The connection bump 220B may include a solder ball or a copper pillar.

In another example, the connection pad 220P of the second semiconductor chip 220 may directly contact an upper surface of the second redistribution substrate 210, and may be electrically connected to the redistribution patterns through vias in the second redistribution substrate 210.

The second encapsulant 230 may include the same or similar material to the encapsulant 140 of the semiconductor package 100A.

The second semiconductor package 200A may be physically/electrically connected to the semiconductor package 100A by a second connection bump 240. The second connection bump 240 may be electrically connected to redistribution patterns inside the second redistribution substrate 210 through the redistribution pad 211 on a lower surface of the second redistribution substrate 210. Alternatively, the second connection bump 240 may be electrically connected to the redistribution patterns through an under bump metal disposed on the redistribution pad 211 on the lower surface of the second redistribution substrate 210. Each of the second connection bump 240 may be composed of a low melting point metal, for example, tin (Sn) or an alloy containing tin (Sn), respectively.

Meanwhile, among the components illustrated in FIG. 13, components having the same reference numerals as in FIG. 1 are similar to those illustrated in FIG. 1, and thus descriptions thereof will be omitted.

By way of summation and review, it may be required to improved rigidity of a semiconductor package, when a separate structure, e.g., a printed circuit board, is embedded in the semiconductor package. However, during the manufacturing process of such a semiconductor package, manufacturing costs may increase, while the yield may be decrease, due to an increased number of manufacturing stages, e.g., fine foreign matter may be generated during processing of the separate structure.

In contrast, an aspect of embodiments provides a semiconductor package having excellent rigidity and improved warpage and heat dissipation characteristics, while minimizing a total number of manufacturing processes. That is, according to example embodiments, a semiconductor package may include a core member improving rigidity (e.g., stiffness) and a vertical connection conductor forming an electrical path in the package that are formed simultaneously by etching a single metal plate. The core member and the vertical connection conductor may have a tapered vertical cross-sectional shape, respectively, by the etching process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a redistribution substrate having a first surface and a second surface opposite each other, the redistribution substrate including a first redistribution layer;
a semiconductor chip on the first surface of the redistribution substrate, the semiconductor chip including a connection pad connected to the first redistribution layer;
at least one vertical connection conductor on the first surface of the redistribution substrate, the at least one vertical connection conductor being electrically connected to the connection pad of the semiconductor chip through the first redistribution layer;
a core member including a first through-hole and at least one second through-hole, the first through-hole accommodating the semiconductor chip, and the at least one second through-hole accommodating the at least one vertical connection conductor;
an encapsulant covering the semiconductor chip on the first surface of the redistribution substrate, the encapsulant filling the first through-hole and the at least one second through-hole; and
a redistribution member on the encapsulant, the redistribution member including a second redistribution layer electrically connected to the at least one vertical connection conductor,
wherein the at least one vertical connection conductor and the core member include a same material,
wherein a width of a lower surface of the at least one vertical connection conductor is narrower than a width of an upper surface of the at least one vertical connection conductor, the lower surface of the at least one vertical connection conductor facing the redistribution substrate,
wherein a width of a lower end of the first through-hole is greater than a width of an upper end of the first through-hole, and
wherein a width of a lower end of the at least one second through-hole is greater than a width of an upper end of the at least one second through-hole, the lower ends of the first through-hole and the at least one second through-hole facing the redistribution substrate.

2. The semiconductor package as claimed in claim 1, wherein the at least one vertical connection conductor and the core member are insulated from each other by the encapsulant.

3. The semiconductor package as claimed in claim 1, wherein:
the at least one vertical connection conductor has a vertical cross-sectional shape, in which a side surface thereof is tapered,
the first through-hole has a vertical cross-sectional shape, in which a first sidewall surface is tapered, and
the at least one second through-hole has a vertical cross-sectional shape, in which a second sidewall surface is tapered.

4. The semiconductor package as claimed in claim 3, wherein:
the at least one vertical connection conductor has a vertical cross-sectional shape, in which the side surface is concave,
the first through-hole has a vertical cross-sectional shape, in which the first sidewall surface is convex, and
the at least one second through-hole has a vertical cross-sectional shape, in which the second sidewall surface is convex.

5. The semiconductor package as claimed in claim 1, wherein the core member has a vertical cross-sectional shape, in which an external side surface thereof is tapered.

6. The semiconductor package as claimed in claim 5, wherein the encapsulant covers the external side surface of the core member.

7. The semiconductor package as claimed in claim 1, wherein the upper surface of the at least one vertical connection conductor, an upper surface of the core member, and an upper surface of the encapsulant are coplanar.

8. The semiconductor package as claimed in claim 7, wherein the redistribution member includes:
an insulating layer directly on the coplanar upper surfaces of the at least one vertical connection conductor, the core member, and the encapsulant,
a second redistribution layer on the insulating layer, and
a redistribution via penetrating the insulating layer to connect the second redistribution layer and the at least one vertical connection conductor.

9. The semiconductor package as claimed in claim 1, wherein:
the lower surface of the at least one vertical connection conductor and a lower surface of the core member are at a higher level than a lower surface of the semiconductor chip,
the encapsulant covers the lower surface of the at least one vertical connection conductor and the lower surface of the core member, and
a lower surface of the encapsulant is at a same level as the lower surface of the semiconductor chip.

10. The semiconductor package as claimed in claim 9, wherein:
the encapsulant has a first via hole exposing a portion of the lower surface of the at least one vertical connection conductor,
the redistribution substrate includes:
an insulating layer on the lower surface of the encapsulant and the lower surface of the semiconductor chip, and having a second via hole exposing a portion of the lower surface of the at least one vertical connection conductor in the first via hole, the first redistribution layer on the insulating layer, and
a redistribution via filling the second via hole, and connecting the first redistribution layer to the at least one vertical connection conductor, and
sidewall surfaces of the first and second via holes are spaced apart from each other.

11. The semiconductor package as claimed in claim 9, wherein:
the encapsulant has a first via hole exposing a portion of the lower surface of the at least one vertical connection conductor,
the redistribution substrate includes:
an insulating layer on the lower surface of the encapsulant and the lower surface of the semiconductor chip, and having a second via hole connected to the first via hole, and
a redistribution via filling the first and second via holes, and connecting the first redistribution layer to the at least one vertical connection conductor, and
sidewall surfaces of the first and second via holes are on a same plane with each other.

12. The semiconductor package as claimed in claim 1, wherein:
a lower surface of the encapsulant is coplanar with the lower surface of the at least one vertical connection conductor and a lower surface of the core member, and
the redistribution substrate includes:
an insulating layer directly on the coplanar lower surfaces of the encapsulant, the at least one vertical connection conductor, and the core member,
the first redistribution layer on the insulating layer, and
a redistribution via penetrating the insulating layer and connecting the first redistribution layer to the at least one vertical connection conductor.

13. The semiconductor package as claimed in claim 1, wherein:
the at least one vertical connection conductor includes a plurality of vertical connection conductors spaced apart from each other,
the core member includes a plurality of second through-holes accommodating each of the plurality of vertical connection conductors, and
the plurality of second through-holes are spaced apart from each other.

14. The semiconductor package as claimed in claim 1, wherein:
the at least one vertical connection conductor includes a plurality of vertical connection conductors spaced apart from each other,
the core member includes a plurality of second through-holes accommodating each of the plurality of vertical connection conductors, and
at least a portion of the plurality of second through-holes are connected to each other.

15. The semiconductor package as claimed in claim 1, wherein the core member has a plate shape having a thickness equal to or greater than a thickness of the semiconductor chip.

16. The semiconductor package as claimed in claim 1, further comprising:
a passivation layer on the second surface of the redistribution substrate and having an opening exposing a portion of the first redistribution layer;
an underbump metal on the opening and electrically connected to the exposed portion of the first redistribution layer; and a connection bump on the passivation layer and electrically connected to the first redistribution layer through the underbump metal.

17. A semiconductor package, comprising:
a redistribution substrate including a first redistribution layer;
a semiconductor chip on the redistribution substrate and connected to the first redistribution layer;
a vertical connection conductor on the redistribution substrate, and electrically connected to the semiconductor chip through the first redistribution layer;
a core member having a first through-hole accommodating the semiconductor chip and a second through-hole accommodating the vertical connection conductor; and
an encapsulant covering at least a portion of each of the semiconductor chip, the vertical connection conductor, and the core member, the encapsulant filling the first and second through-holes,
wherein the vertical connection conductor has a cross-sectional shape, in which a side surface of the vertical connection conductor is tapered such that a width of a lower surface thereof is narrower than a width of an upper surface thereof, and
the first and second through-holes have a cross-sectional shape tapered in a direction opposite to the vertical connection conductor, respectively.

18. The semiconductor package as claimed in claim 17, wherein:
the core member has a plate shape having a thickness equal to or greater than a thickness of the semiconductor chip, and
the vertical connection conductor has a thickness substantially equal to the thickness of the core member.

19. The semiconductor package as claimed in claim 17, wherein the core member and the vertical connection conductor include a same metal material.

20. A semiconductor package, comprising:
a redistribution substrate including a first redistribution layer;
a semiconductor chip on the redistribution substrate, and having a connection pad connected to the first redistribution layer;
a vertical connection conductor spaced apart from the semiconductor chip on the redistribution substrate, and electrically connected to the connection pad through the first redistribution layer;
a core member having a first through-hole accommodating the semiconductor chip and a second through-hole accommodating the vertical connection conductor;
an encapsulant on the redistribution substrate and filling the first and second through-holes, respectively, the encapsulant covering an upper surface of the semiconductor chip and an external side surface of the core member; and
a redistribution member on an upper surface of the encapsulant, and having a second redistribution layer electrically connected to the vertical connection conductor,
wherein the upper surface of the encapsulant is coplanar with an upper surface of the vertical connection conductor and an upper surface of the core member,
a planar area of a lower surface of the vertical connection conductor is smaller than a planar area of the upper surface of the vertical connection conductor, and
a planar area of a lower surface of the core member is smaller than a planar area of the upper surface of the core member.

* * * * *